US011866831B2

(12) United States Patent
Netzband et al.

(10) Patent No.: US 11,866,831 B2
(45) Date of Patent: Jan. 9, 2024

(54) METHODS FOR WET ATOMIC LAYER ETCHING OF COPPER

(71) Applicant: Tokyo Electron Limited, Tokyo (JP)

(72) Inventors: Christopher Netzband, Albany, NY (US); Paul Abel, Austin, TX (US); Jacques Faguet, Austin, TX (US); Arkalgud Sitaram, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 141 days.

(21) Appl. No.: 17/725,072

(22) Filed: Apr. 20, 2022

(65) Prior Publication Data
US 2023/0140900 A1    May 11, 2023

Related U.S. Application Data

(60) Provisional application No. 63/277,443, filed on Nov. 9, 2021.

(51) Int. Cl.
| C23F 1/18 | (2006.01) |
| H01L 21/306 | (2006.01) |
| C23G 1/10 | (2006.01) |
| H01L 21/3213 | (2006.01) |
| C23F 1/34 | (2006.01) |
| C23G 5/028 | (2006.01) |

(52) U.S. Cl.
CPC ............... *C23F 1/18* (2013.01); *C23F 1/34* (2013.01); *C23G 1/103* (2013.01); *H01L 21/30604* (2013.01); *H01L 21/32134* (2013.01); *C23G 5/02867* (2013.01)

(58) Field of Classification Search
None
See application file for complete search history.

(56) References Cited

U.S. PATENT DOCUMENTS

| 5,374,328 A | 12/1994 | Remba et al. |
| 5,482,174 A | 1/1996 | Namiki et al. |
| 6,054,333 A | 4/2000 | Bensaoula |
| 6,616,014 B1 | 9/2003 | Pozniak et al. |

(Continued)

FOREIGN PATENT DOCUMENTS

| EP | 2862959 | * 4/2015 | ............... C23F 1/18 |
| KR | 1020170077839 | 12/2016 | |

(Continued)

OTHER PUBLICATIONS

A. Iwasaki et.al., "Study of Copper Surface Preparation by Sequential Atomic Layer Wet Etching and Laser Annealing Treatments", ECS Transactions, vol. 80, pp. 233-241. (Year: 2017).*

(Continued)

*Primary Examiner* — Jiong-Ping Lu
(74) *Attorney, Agent, or Firm* — Egan, Enders & Huston LLP.

(57) ABSTRACT

The present disclosure provides a new wet atomic layer etch (ALE) process for etching copper. More specifically, the present disclosure provides various embodiments of methods that utilize new etch chemistries for etching copper in a wet ALE process. By utilizing the new etch chemistries disclosed herein within a wet ALE process, the present disclosure provides a highly selective etch of copper with monolayer precision.

22 Claims, 16 Drawing Sheets

(56) References Cited

U.S. PATENT DOCUMENTS

| | | | |
|---|---|---|---|
| 6,805,769 | B2 | 10/2004 | Okuda et al. |
| 6,841,031 | B2 | 1/2005 | Iwata et al. |
| 6,896,600 | B1 | 5/2005 | Wu et al. |
| 7,582,181 | B2 | 9/2009 | Babic |
| 9,953,826 | B2 | 4/2018 | Kaneko et al. |
| 10,157,756 | B2 | 12/2018 | Yamada et al. |
| 10,784,175 | B2 | 9/2020 | Clark |
| 10,861,744 | B2 | 12/2020 | Trickett et al. |
| 10,982,335 | B2 | 4/2021 | Abel |
| 2002/0004303 | A1 | 1/2002 | Agnello et al. |
| 2003/0087528 | A1 | 5/2003 | Kruwinus et al. |
| 2006/0289389 | A1 | 12/2006 | Shea |
| 2009/0007938 | A1 | 1/2009 | Dubreuil et al. |
| 2009/0047790 | A1 | 2/2009 | Raghu et al. |
| 2010/0279435 | A1 | 11/2010 | Xu et al. |
| 2011/0094888 | A1 | 4/2011 | Chen et al. |
| 2012/0031768 | A1 | 2/2012 | Reid et al. |
| 2014/0199840 | A1 | 7/2014 | Bajaj et al. |
| 2014/0370643 | A1 | 12/2014 | Stern et al. |
| 2016/0089686 | A1 | 3/2016 | Lee et al. |
| 2016/0141210 | A1 | 5/2016 | Lei et al. |
| 2016/0372320 | A1 | 12/2016 | Emoto |
| 2017/0186621 | A1 | 6/2017 | Zaitsu |
| 2017/0356084 | A1 | 12/2017 | Nakanishi et al. |
| 2018/0061675 | A1 | 3/2018 | Heehwan et al. |
| 2018/0090352 | A1 | 3/2018 | Sotoku et al. |
| 2018/0226278 | A1 | 8/2018 | Arnepalli et al. |
| 2018/0374936 | A1 | 12/2018 | Kelly et al. |
| 2019/0011734 | A1 | 1/2019 | Otsuji |
| 2019/0027383 | A1 | 1/2019 | Nakai et al. |
| 2019/0148192 | A1 | 5/2019 | Yamaguchi |
| 2019/0295846 | A1 | 9/2019 | Clark et al. |
| 2020/0075351 | A1 | 3/2020 | Zandi et al. |
| 2020/0161148 | A1 | 5/2020 | Abel |
| 2020/0168467 | A1 | 5/2020 | Higuchi et al. |
| 2021/0090897 | A1 | 3/2021 | Deepak et al. |

FOREIGN PATENT DOCUMENTS

| | | |
|---|---|---|
| KR | 1020170022922 | 3/2017 |
| WO | 2018004649 | 1/2018 |

OTHER PUBLICATIONS

International Search Report, PCT/US2019/061678, dated Mar. 13, 2020, 8 pgs.

International Search Report, PCT/US2019/061683, dated Mar. 13, 2020, 9 pgs.

International Search Report and Written Opinion; PCT/US2022/043508; dated Jan. 4, 2023, 8 pgs.

* cited by examiner

METHODS FOR WET ATOMIC LAYER ETCHING OF COPPER

This application claims priority to U.S. Provisional Patent Application Ser. No. 63/277,443, filed Nov. 9, 2021, entitled "Method for Wet Atomic Layer Etching of Copper"; the disclosure of which is expressly incorporated herein, in its entirety, by reference.

This application is related to co-pending, commonly owned U.S. patent application Ser. No. 17/674,579, filed Feb. 17, 2022, entitled "Methods for Wet Atomic Layer Etching of Ruthenium," the disclosure of which is expressly incorporated herein, in its entirety, by reference.

BACKGROUND OF THE INVENTION

This disclosure relates to semiconductor device manufacturing, and, in particular, to the etching and removal of metals, such as but not limited to copper (Cu) metal. During routine semiconductor fabrication, various metals formed on a substrate may be removed by patterned etching, chemical-mechanical polishing, as well as other techniques. A variety of techniques are known for etching layers on a substrate, including plasma-based or vapor phase (dry etching), or liquid based (wet etching).

Wet etching involves dispensing a chemical solution over the surface of a substrate or immersing the substrate in the chemical solution. Often, the chemical solution contains a solvent, chemicals designed to react with materials on the substrate surface, and chemicals to promote dissolution of the reaction products. The result of exposure of the substrate surface to the etchant is the removal of material from the substrate. Etchant composition and temperature may control the etch rate, specificity, and residual material on the surface of the substrate post etch.

As geometries of substrate structures continue to shrink and the types of structures evolve, the challenges of etching substrates have increased. One technique that has been utilized to address these challenges is atomic layer etching (ALE). ALE processes are generally known to involve processes which remove thin layers sequentially through one or more self-limiting reactions. For example, ALE typically refers to techniques that can etch with atomic precision, i.e., by removing material one or a few monolayers of material at a time. In general, ALE schemes rely on a chemical modification of the surface to be etched followed by the selective removal of the modified layer. Thus, ALE processes offer improved performance by decoupling the etch process into sequential steps of surface modification and removal of the modified surface. Such processes often include multiple cyclic series of layer modification and etch steps. The modification step may modify the exposed surfaces and the etch step may selectively remove the modified layer.

A variety of ALE processes are known, including plasma ALE, thermal ALE and wet ALE techniques. Like all ALE processes, wet ALE is typically a cyclic process that uses sequential, self-limiting reactions to selectively remove material from the surface. Unlike thermal and plasma ALE, however, the reactions used in wet ALE primarily take place in the liquid phase. Compared to other ALE processes, wet ALE is often desirable since it can be conducted at (or near) room temperature and atmospheric pressure. Additionally, the self-limiting nature of the wet ALE process leads to smoothing of the surface during etching rather than the roughening commonly seen during other etch processes.

A wet ALE process typically begins with a surface modification step, which exposes a material to a first solution to create a self-limiting modified surface layer. The modified surface layer may be created through oxidation, reduction, ligand binding, or ligand exchange. Ideally, the modified surface layer is confined to the top monolayer of the material and acts as a passivation layer to prevent the modification reaction from progressing any further. After the modified surface layer is formed, the wet ALE process may expose the modified surface layer to a second solution to selectively dissolve the modified surface layer in a subsequent dissolution step. The dissolution step must selectively dissolve the modified surface layer without removing any of the underlying unmodified material. This selectivity can be accomplished by using a different solvent in the dissolution step than was used in the surface modification step, changing the pH, or changing the concentration of other components in the second solution. The wet ALE cycle can be repeated until a desired or specified etch amount is achieved.

Copper (Cu) metal is commonly used as an interconnect metal in integrated circuits. Copper/copper hybrid bonding for three-dimensional interconnects (3DI) and fully aligned vias (FAVs) rely on sub-nanometer control of the copper pad recess to create electrical contacts, which may be surrounded, for example, by a dielectric material. In some conventional processes, the copper pad recess is achieved through Chemical Mechanical Planarization (CMP). However, as feature size shrinks, the copper and dielectric materials exposed on the substrate surface tend to polish at the same rate, which results in planar areas near the contact pads and severely limits the process window. Some hybrid bonding and FAV process nodes are simply too small for CMP. For example, CMP cannot provide sub-nanometer copper recess control with good copper uniformity for sub-32 nm back end of the line (BEOL) Cu lines for FAVs or sub-100 nm Cu bond pads.

Sequential etching techniques have also been utilized for etching metals, such as copper. Known sequential etching techniques for etching metals often use oxidizing agents (e.g., an oxygen plasma, ozone, or hydrogen peroxide) in a self-limiting oxidation step to form an oxide on exposed surfaces of the metal, and an acid wet etch to selectively remove the oxide. While these known techniques provide a sequential hybrid or wet etch process, they lack atomic layer control due to the aggressive oxidants required to form the oxide in the self-limiting oxidation step. Thus, improved wet etching methods are needed for etching Cu metal that provide etch control at the atomic level, while also achieving high etch selectivity to other materials that are exposed during the etching process.

SUMMARY

The present disclosure provides a new wet atomic layer etch (ALE) process for etching copper (Cu) metal. More specifically, the present disclosure provides various embodiments of methods that utilize new etch chemistries for etching copper in a wet ALE process. By utilizing the new etch chemistries disclosed herein within a cyclic wet ALE process, the present disclosure provides a highly selective etch of copper with monolayer precision.

In the present disclosure, a wet ALE process is provided for etching a copper metal layer formed on a substrate, wherein an exposed surface of the copper metal layer comprises an oxidized copper surface layer (e.g., a copper oxide layer). The wet ALE process is a cyclical process that includes one or more ALE cycles, wherein each ALE cycle includes a complexation step and a dissolution step. In the complexation step, the surface of the substrate is exposed to a complexation solution comprising a complexing agent (e.g., a carboxylate-based ligand) dissolved in a first solvent. The complexing agent reacts with and binds to the oxidized copper surface layer to form a ligand-metal complex (e.g., a complex-bound oxidized copper surface layer), which is insoluble in the first solvent.

After the ligand-metal complex is formed, a dissolution step may be performed to selectively dissolve and remove the ligand-metal complex without removing the underlying copper metal layer. In the dissolution step, the surface of the substrate is exposed to a dissolution solution comprising a reactive agent and an aqueous solvent. The reactive agent reacts with the ligand-metal complex formed during the complexation step to form soluble species, which are dissolved in the aqueous solvent. Removing the ligand-metal complex in the dissolution step exposes the underlying copper metal layer, which reacts with the aqueous solvent in the dissolution solution to re-oxidize the underlying copper metal and form a new oxidized copper surface layer (e.g., a copper hydroxide layer) that can be used to form a new ligand-metal complex in the next ALE cycle. The complexation and dissolution steps may be repeated for one or more ALE cycles until a desired amount of copper metal is removed. Purge steps may be performed between the complexation and dissolution steps to remove the complexation and dissolution solutions from the surface of the substrate, along with excess reactants and soluble species contained therein.

In the present disclosure, the complexation solution includes a carboxylic acid or other ligand dissolved in a first solvent (e.g., an organic solvent, such as isopropyl alcohol, IPA), and the dissolution solution includes a base dissolved in an aqueous solution (such as, e.g., ammonium hydroxide in deionized water). When a carboxylic acid is utilized within the complexation solution, the ligand-metal complex formed during the complexation step is a copper carboxylate layer, which is insoluble within the first solvent used within the complexation solution, but soluble within the aqueous dissolution solution. In one embodiment, oxalic acid may be utilized within the complexation solution to form a copper oxalate layer on the unmodified copper metal layer. It is recognized, however, that other carboxylic acids may also be utilized within the complexation solution to bind to the oxidized copper surface layer and form other copper carboxylate layers, which are insoluble within the first solvent, but soluble within the aqueous dissolution solution.

When oxalic acid is utilized within the complexation solution, the oxalic acid reacts with the oxidized copper surface layer to form a copper oxalate layer on the underlying copper metal layer. In the present disclosure, the complexation solution may be supplied to the surface of the substrate for a period of time needed for at least one monolayer of copper oxalate to be formed on the underlying copper metal layer. Copper oxalate is insoluble in most solvents, but is soluble in ammonium hydroxide solutions through a ligand-exchange mechanism. Thus, in some embodiments, the dissolution solution may comprise an aqueous ammonium hydroxide solution. The ammonium hydroxide included within the dissolution solution selectively removes the copper oxalate layer to expose the copper metal layer underlying the copper oxalate layer. The aqueous solvent included within the dissolution solution re-oxidizes exposed surfaces of the underlying copper metal layer, once the copper oxalate layer is selectively removed, to form a new oxidized copper surface layer (e.g., a copper hydroxide layer) on the underlying copper metal layer. Since metallic copper is also etched by ammonium hydroxide, the concentration of the ammonium hydroxide used within the dissolution solution may be selected to provide good selectivity between the copper oxalate layer and the underlying copper metal layer. In some embodiments, a relatively low concentration (e.g., less than 10 mM) of ammonium hydroxide may be utilized within the dissolution solution to avoid etching the underlying copper metal layer and the oxidized copper surface layer formed thereon.

Cross-contamination of the complexation solution and the dissolution solution results in a continuous etch process, which can lead to increased surface roughness and poor uniformity. To avoid cross-contamination, purge steps may be performed between the complexation and dissolution steps to remove excess reactants from the substrate surface and prevent continuous etching during the dissolution step. In some embodiments, a purge solution may be supplied to the substrate surface to remove excess reactants and soluble species from the substrate surface after each complexation and dissolution step.

As noted above and described further herein, the present disclosure provides various embodiments of methods that utilize the new etch chemistries disclosed herein for etching copper in a wet ALE process. Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

According to one embodiment, a method of etching is provided herein for etching copper in accordance with the present disclosure. The method may generally begin by receiving a substrate having a copper metal layer formed thereon, wherein an oxidized copper surface layer of the copper metal layer is exposed on a surface of the substrate. Next, the method may include exposing the surface of the substrate to a complexation solution comprising a carboxylic acid dissolved in an organic solvent. The carboxylic acid may react with the oxidized copper surface layer to form a copper carboxylate layer, which is insoluble within the organic solvent. Next, the method may include removing the complexation solution from the surface of the substrate subsequent to forming the copper carboxylate layer, and exposing the surface of the substrate to a dissolution solution to selectively remove the copper carboxylate layer and expose the copper metal layer underlying the copper carboxylate layer. The dissolution solution may generally include a reactive agent and an aqueous solvent. The reactive agent may react with the copper carboxylate layer to form soluble species, which are dissolved by the aqueous solvent. Next, the method may include removing the dissolution solution and the soluble species from the surface of the substrate to etch the copper metal layer.

In some embodiments, the method may further include repeating the steps of exposing the surface of the substrate to the complexation solution, removing the complexation solution, exposing the surface of the substrate to the dissolution solution, and removing the dissolution solution a number of cycles until a predetermined amount of the copper metal is removed from the substrate. In some embodiments, said removing the complexation solution and said removing the dissolution solution may each include rinsing the surface of the substrate with a purge solution to remove excess reactants from the surface of the substrate and prevent the complexation solution and the dissolution solution from mixing.

A wide variety of etch chemistries may be used within the complexation and dissolution solutions. In some embodiments, for example, the complexation solution may include: (a) a carboxylic acid, such as oxalic acid, mandelic acid, malic acid, maleic acid or fumaric acid, and (b) an organic solvent, such as isopropyl alcohol (IPA) or another alcohol, diethyl ether (($C_2H_5$)$_2$O), acetonitrile ($C_2H_3N$), dimethyl sulfoxide ($C_2H_6OS$), a ketone or an acetate. Other carboxylate acids and organic solvents may also be used within the complexation solution.

In some embodiments, the dissolution solution may include an aqueous base solution. The reactive agent included within the dissolution solution may be substantially any weak base. For example, the reactive agent may be ammonium hydroxide ($NH_4OH$), potassium hydroxide (KOH), sodium hydroxide (NaOH), tetramethylammonium hydroxide (($CH_3$)$_4$NOH), potassium carbonate ($K_2CO_3$) or ammonium carbonate (($NH_4$)$_2CO_3$). Other weak bases may also be included within the dissolution solution.

In one example embodiment, the carboxylic acid included within the complexation solution may be oxalic acid, wherein the organic solvent included within the complexation solution may be isopropyl alcohol (IPA). In such an embodiment, the oxalic acid may react with the oxidized copper surface layer to form a copper oxalate layer, which is insoluble within IPA, but soluble with the aqueous solvent included within the dissolution solution.

In some embodiments, said exposing the surface of the substrate to the complexation solution may include supplying the complexation solution to the surface of the substrate for a period of time needed to form at least one monolayer of the copper carboxylate layer on the underlying copper metal layer. When the carboxylic acid is oxalic acid, the complexation solution may be supplied to the surface of the substrate for at least 5 seconds to form at least one monolayer of copper oxalate on the underlying copper metal layer.

After exposing the surface of the substrate to the dissolution solution to selectively remove the copper carboxylate layer and expose the underlying copper metal layer, the dissolution solution may re-oxidize an exposed surface of the underlying copper metal layer to form a new oxidized copper surface layer. The dissolution solution, however, does not etch the underlying copper metal layer or the new oxidized copper surface layer.

In one example embodiment, the dissolution solution may contain aqueous ammonium hydroxide ($NH_4OH$). When aqueous ammonium hydroxide is utilized, a concentration of the ammonium hydroxide in the dissolution solution may be maintained below a level that etches the underlying copper metal layer or the new oxidized copper surface layer after selectively removing the copper carboxylate layer.

According to another embodiment, a method of etching copper using a wet atomic layer etching (ALE) process is provided herein in accordance with the present disclosure. The method may generally include: a) receiving a substrate having a copper (Cu) metal layer with an oxidized Cu surface layer formed thereon, b) exposing the oxidized Cu surface layer to a complexation solution comprising a complexing agent to bind the complexing agent to the oxidized Cu surface layer and form a complex-bound oxidized Cu surface layer on the Cu metal layer, c) rinsing the substrate with a first purge solution to remove the complexation solution from a surface of the substrate; d) selectively removing the complex-bound oxidized Cu surface layer from the Cu metal layer by exposing the complex-bound oxidized Cu surface layer to a dissolution solution that dissolves the complex-bound oxidized Cu surface layer and forms a new oxidized Cu surface layer on the Cu metal layer; and e) rinsing the substrate with a second purge solution to remove the dissolution solution from the surface of the substrate and etch the Cu metal layer.

In one embodiment, the method may further include repeating steps b)-e) at least once to further etch the Cu metal layer. In some embodiments, steps b) and d) have no temporal overlap. In some embodiments, the substrate may have an exposed dielectric layer thereon that is not etched by steps b)-e).

As noted above, a wide variety of etch chemistries may be used within the complexation and dissolution solutions. In some embodiments, the complexation solution may include the complexing agent dissolved in an organic solvent. In one example embodiment, the complexing agent may include oxalic acid dissolved in isopropyl alcohol (IPA). Other carboxylate acids and organic solvents may also be used within the complexation solution.

In some embodiments, the dissolution solution may include an aqueous base solution. In one example embodiment, the dissolution solution may contain ammonium hydroxide ($NH_4OH$) dissolved in an aqueous solvent. Other bases may also be included within the dissolution solution. However, it is important that the dissolution solution does not etch the Cu metal layer or the new oxidized Cu surface layer. When the dissolution solution contains ammonium hydroxide ($NH_4OH$), a concentration of the ammonium hydroxide in the dissolution solution may be selected and maintained below a level that etches the Cu metal layer or the new oxidized Cu surface layer after selectively removing the complex-bound oxidized Cu surface layer.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Figure 1:
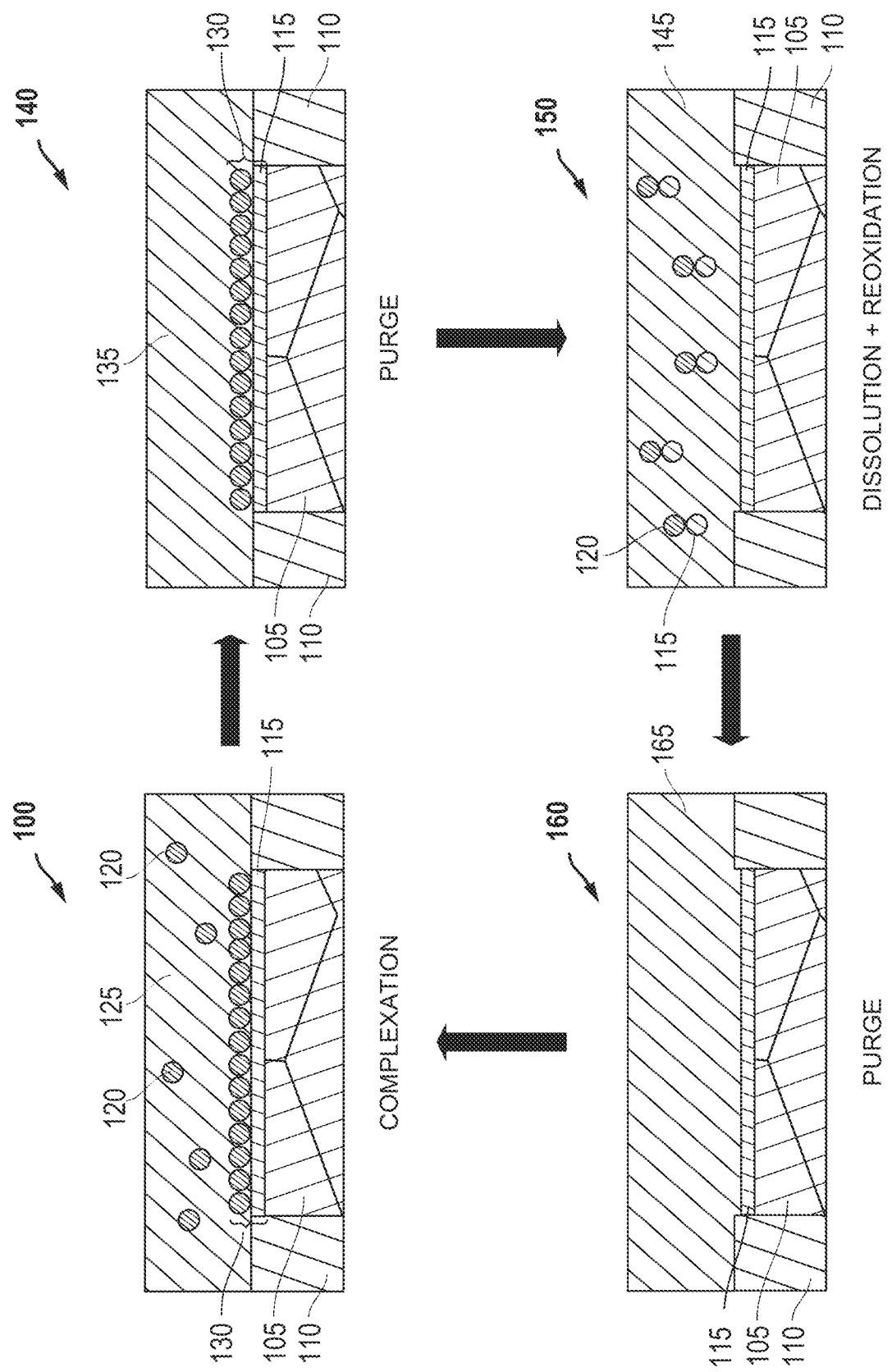
FIG. 1 illustrates one example of a cyclic wet atomic layer etching (ALE) process that can be used to etch copper in accordance with the present disclosure.

The present disclosure provides a new wet atomic layer etch (ALE) process for etching copper (Cu) metal. More specifically, the present disclosure provides various embodiments of methods that utilize new etch chemistries for etching copper in a cyclic wet ALE process. By utilizing the new etch chemistries disclosed herein within a cyclic wet ALE process, the present disclosure provides a highly selective etch of copper with monolayer precision.

The cyclic wet ALE process described herein may generally include one or more ALE cycles, wherein each ALE cycle includes a complexation step and a dissolution step. In the complexation step, a copper metal layer having an oxidized copper surface layer is exposed to complexation solution, which includes a complexing agent dissolved in a first solvent. In some embodiments, the complexation solution may contain a carboxylic acid dissolved in an organic solvent. The carboxylic acid reacts with and binds to the oxidized copper surface layer to form an insoluble copper carboxylate layer over the unmodified copper metal layer. After the copper carboxylate layer is formed, a dissolution step is performed to selectively remove the copper carboxylate layer from the underlying copper metal layer. For example, the copper carboxylate layer may be dissolved in a dissolution solution, which includes a reactive agent dissolved in an aqueous solvent. The dissolution solution selectively removes the copper carboxylate layer without removing the unmodified copper metal layer underlying the copper carboxylate layer. Removing the copper carboxylate layer exposes the underlying copper metal layer, which then reacts with the aqueous solvent within the dissolution solution to re-oxidize the underlying copper metal layer and form a new oxidized copper surface layer that can be used to form a new copper carboxylate layer in the next ALE cycle. The complexation and dissolution steps may be repeated for one or more ALE cycles until a desired amount of the copper metal layer is removed. Purge steps are performed between the complexation and dissolution steps to remove excess reactants from the substrate surface and to prevent the complexation and dissolution solutions from mixing, thus, preventing continuous etching during the dissolution step.

The techniques described herein for etching copper may be utilized in a wide variety of applications. In some embodiments, for example, the wet ALE process and methods disclosed herein may be used for etching copper pad recesses to create electrical contacts in three-dimensional interconnect (3DI) hybrid bonding and fully aligned via (FAV) applications. The disclosed process and methods offer multiple advantages over conventional methods commonly used for etching copper. Unlike conventional CMP techniques used for planarizing copper pads, for example, the wet ALE process and methods disclosed herein provide sub-nanometer control of copper pad recesses with high selectivity to the dielectric material (e.g., silicon oxide) surrounding the copper pads. This makes the wet ALE process and methods disclosed herein well-suited as a supplement for CMP, especially at small pad sizes.

Unlike conventional hybrid and wet etch processes commonly used for etching metals, such as copper, the wet ALE process and methods disclosed herein do not use strong oxidizers to form an oxide on exposed surfaces of the copper metal layer in a self-limiting oxidation step. Instead, the wet ALE process and methods disclosed herein dispense a complexation solution onto the substrate surface for a predetermined amount of time needed to form at least one monolayer of carboxylic acid on the oxidized copper surface layer. The monolayer of carboxylic acid reacts with and binds to the oxidized copper surface layer on the underlying copper metal layer to form a copper carboxylate monolayer. The copper carboxylate monolayer is then selectively removed in the subsequently performed dissolution step without removing the unmodified copper metal layer underlying the copper carboxylate monolayer or the dielectric material surrounding the copper metal layer. As a result, the wet ALE process and methods disclosed herein provide atomic level etch control of the copper carboxylate layer, while also achieving high etch selectivity to other materials (e.g., dielectric materials, the unmodified copper metal layer and the oxidized copper surface layer) that are exposed during the etch process.

FIG. 1 illustrates one example of a wet ALE process that may be used for etching copper in accordance with the present disclosure. More specifically, FIG. 1 illustrates exemplary steps performed during one cycle of a wet ALE process, which may be utilized for etching a copper metal layer in accordance with the present disclosure. As shown in FIG. 1 and described in more detail below, the wet ALE process described herein is a cyclical process consisting of one or more ALE cycles, where each ALE cycle includes a complexation step 100, a first purge step 140, a dissolution step 150 and a second purge step 160.

In the process shown in FIG. 1, a copper metal layer 105 surrounded by a dielectric material 110 is brought in contact with a complexation solution 125 during the complexation step 100 to react with and bind to an oxidized copper surface layer 115 (e.g., a copper oxide surface layer) of the copper metal layer 105. The complexation solution 125 used within the complexation step 100 may generally contain a complexing agent 120 dissolved in a first solvent. In some embodiments, the complexing agent 120 may be a carboxylic acid and the first solvent may be an organic solvent. In one example embodiment, the complexing agent 120 may be oxalic acid and the first solvent may be isopropyl alcohol (IPA). However, other complexing agents and solvents may also be utilized, as discussed in more detail below.

During the complexation step 100 shown in FIG. 1, the complexing agent 120 reacts with and binds to the oxidized copper surface layer 115 to form a ligand-metal complex 130. In some embodiments, the complexing agent 120 may include a carboxylate-based ligand (e.g., a carboxylic acid, such as but not limited to, oxalic acid), which selectively binds to the oxidized copper surface layer 115 and causes the oxidized copper surface layer 115 to react with the carboxylate-based ligand to form an insoluble ligand-metal complex 130. When a carboxylate-based ligand is used, the ligand-metal complex 130 formed during the complexation step 100 is a copper carboxylate layer, which is insoluble within the first solvent, but soluble in the subsequently performed dissolution step 150.

In some embodiments, the complexation solution 125 may be dispensed onto the substrate surface for a predetermined amount of time needed to form at least one monolayer of carboxylic acid on the oxidized copper surface layer 115. When oxalic acid is included within the complexation solution 125, multiple monolayers of oxalic acid may be formed on the oxidized copper surface layer 115 after certain amount of time. This is because oxalic acid has high packing density and can form multiple monolayers on the oxidized copper surface layer 115 through hydrogen bonding (see, e.g., FIG. 10). The extra monolayers of oxalic acid may be removed from the oxidized copper surface layer 115 when the substrate surface is rinsed after the complexation step 100, thereby leaving a single monolayer of oxalic acid on the oxidized copper surface layer 115 after the rinse.

After the complexation step 100 is performed to form the ligand-metal complex 130 (e.g., the copper carboxylate layer), a first purge step 140 is performed to remove the complexation solution 125 from the surface of the substrate. In the first purge step 140, the substrate is rinsed with a first purge solution 135 to remove excess reactants from the surface of the substrate and/or to remove extra monolayers of oxalic acid from the oxidized copper surface layer 115.

The first purge solution 135 should not react with the ligand-metal complex 130 formed during the complexation step 100, or with the reagents present in the complexation solution 125. In some embodiments, the first purge solution 135 used within the first purge step 140 may use the same solvent (e.g., IPA) used in the complexation solution 125. However, other solvents may also be utilized, as discussed in more detail below. In some embodiments, the first purge step 140 may be long enough to completely remove all excess reactants from the substrate surface.

After the substrate is rinsed, a dissolution step 150 is performed to selectively remove the ligand-metal complex 130 (e.g., the copper carboxylate layer) formed during the complexation step 100. In the dissolution step 150, the substrate is exposed to a dissolution solution 145 to selectively remove or dissolve the ligand-metal complex 130 without removing the unmodified copper metal layer 105 underlying the ligand-metal complex 130 or the dielectric material 110 surrounding the copper metal layer 105. The dissolution solution 145 may generally contain a reactive agent dissolved in an aqueous solvent (such as, e.g., deionized water). In some embodiments, the reactive agent may be a base, such as ammonium hydroxide ($NH_4OH$), and the aqueous solvent may be deionized water (DI $H_2O$). Other reactive agents and solvents may also be utilized, as discussed in more detail below. In order to selectively remove the ligand-metal complex 130, the ligand-metal complex 130 must be soluble, and the unmodified copper metal layer 105 underlying the ligand-metal complex 130 must be insoluble, in the dissolution solution 145. The solubility of the ligand-metal complex 130 allows its removal through dissolution into the bulk dissolution solution 145. In some embodiments, the dissolution step 150 may continue until the ligand-metal complex 130 is completely dissolved.

The wet ALE process shown in FIG. 1 utilizes a ligand binding followed by dissolution method to selectively remove the ligand-metal complex 130 without removing the unmodified copper metal layer 105 underlying the ligand-metal complex 130. In the ligand binding followed by dissolution method, the ligand binding and dissolution steps have no temporal overlap. Instead, the ligand is dissolved in a liquid solvent (e.g., an organic solvent, such as IPA, which is used within the complexation solution 125) in which the ligand-metal complex 130 is insoluble. During the complexation step 100, the ligand dissolved within the liquid solvent reacts with the oxidized copper surface layer 115 to form an insoluble layer of ligand-metal complex 130. This insoluble layer is later dissolved in the dissolution step 150 when the surface of the substrate is exposed to a different liquid solvent (e.g., an aqueous solvent, such as DI $H_2O$, which is used within the dissolution solution 145) in which the ligand-metal complex 130 is soluble. In the ligand binding followed by dissolution method, removal of the ligand-metal complex 130 (e.g., the copper carboxylate layer) is limited by the ligand packing density of the ligand on the surface. The ligand binding in the complexation step 100, and therefore, the dissolution of the ligand-metal complex 130 in the dissolution step 150, is self-limiting.

Removing the ligand-metal complex 130 (e.g., the copper carboxylate layer) in the dissolution step 150 exposes the underlying copper metal layer 105 to the dissolution solution 145. The exposed surfaces of the underlying copper metal layer 105 react with the aqueous solvent (e.g., DI $H_2O$) within the dissolution solution 145 to re-oxidize the copper metal layer 105 and form a new oxidized copper surface layer 115 on the underlying copper metal layer 105.

Once the ligand-metal complex 130 (e.g., the copper carboxylate layer) is dissolved within the dissolution solution 145 and the new oxidized copper surface layer 115 is formed, the wet ALE etch cycle shown in FIG. 1 may be completed by performing a second purge step 160 to remove the dissolution solution 145 from the surface of the substrate. In the second purge step 160, the substrate is rinsed with a second purge solution 165, which may be the same or different than the first purge solution 135. In some embodiments, the second purge solution 165 may use the same solvent used within the complexation solution 125 (e.g., IPA). However, other solvents may also be utilized, as discussed in more detail below. The second purge step 160 may generally continue until the dissolution solution 145 and/or the reactants and soluble species contained with the dissolution solution 145 are completely removed from the surface of the substrate.

Embodiments of the present disclosure describe wet ALE of a copper (Cu) metal layer on a substrate. The wet ALE process described herein is a highly uniform, cyclical etch process, which provides Cu etch control at the atomic level, while also achieving high etch selectivity to other materials, such as for example, silicon oxide and other dielectric materials. As described above, the cyclical wet ALE process shown in FIG. 1 may generally include: a) receiving a substrate having a copper metal layer 105 with an oxidized copper surface layer 115 formed thereon, b) exposing the oxidized copper surface layer 115 to a complexation solution 125 comprising a complexing agent 120 to bind the complexing agent 120 to the oxidized copper surface layer 115 and form a complex-bound oxidized copper surface layer (e.g., a ligand-metal complex 130) on the copper metal layer 105; c) rinsing the substrate with a first purge solution 135 to remove the complexation solution 125 from a surface of the substrate; d) selectively removing the complex-bound oxidized copper surface layer from the copper metal layer 105 by exposing the complex-bound oxidized copper surface layer to a dissolution solution 145 that dissolves the complex-bound oxidized copper surface layer and forms a new oxidized copper surface layer 115 on the copper metal layer 105; and e) rinsing the substrate with a second purge solution 165 to remove the dissolution solution 145 from the surface of the substrate and etch the copper metal layer 105. In some embodiments, the steps b)-e) may be repeated for one or more ALE cycles, until a desired amount of the copper metal layer 105 has been removed. It is recognized that the cyclic wet ALE process shown in FIG. 1 is merely one example of an etch process that may be used to etch copper in accordance with the present disclosure.

Wet ALE of a copper metal requires the formation of a self-limiting passivation layer on the copper metal surface. The formation of this passivation layer is accomplished by exposure of an oxidized copper metal surface layer to a first etch solution (i.e., complexation solution 125) that enables or causes a chemical reaction between the species in solution and the oxidized copper metal surface layer. This passivation layer must be insoluble in the solution used for its formation, but freely soluble in a second etch solution (i.e., dissolution solution 145) used for its dissolution. The self-limiting passivation layer must be removed every cycle after its formation. The second etch solution is used to selectively dissolve the passivation layer without etching the underlying unmodified copper metal layer.

Wet ALE provides numerous advantages over other etch techniques. One advantage of wet ALE is that it can be conducted near room temperature and at atmospheric pressure. Additionally, the self-limiting nature of the wet ALE process leads to smoothing of the surface during etching rather than the roughening typically seen when other etch techniques are used. The wet ALE process described herein for etching copper provides additional advantages, as discuss further herein.

According to one embodiment, the wet ALE process described herein uses alternating solutions of oxalic acid ($C_2H_2O_2$) in isopropyl alcohol (IPA) and ammonium hydroxide ($NH_4OH$) in deionized water (DI $H_2O$) to etch a copper (Cu) metal layer. As shown in FIG. 1 and described above, each etch cycle of the wet ALE process may include a complexation step 100, a first purge step 140, a dissolution step 150 and a second purge step 160. In one example implementation, each etch cycle of the wet ALE process described herein for etching a copper metal layer may include a 5 second dispense of a complexation solution 125 containing oxalic acid, a 5 second IPA rinse, a 5 second dispense of a dissolution solution 145 containing ammonium hydroxide, and a 5 second IPA rinse. The etch cycle can be repeated at least once until a desired etch amount of the Cu metal is achieved. In some embodiments, the purge times between the complexation and dissolution steps may be reduced, for example, to 3 seconds.

Figure 9:
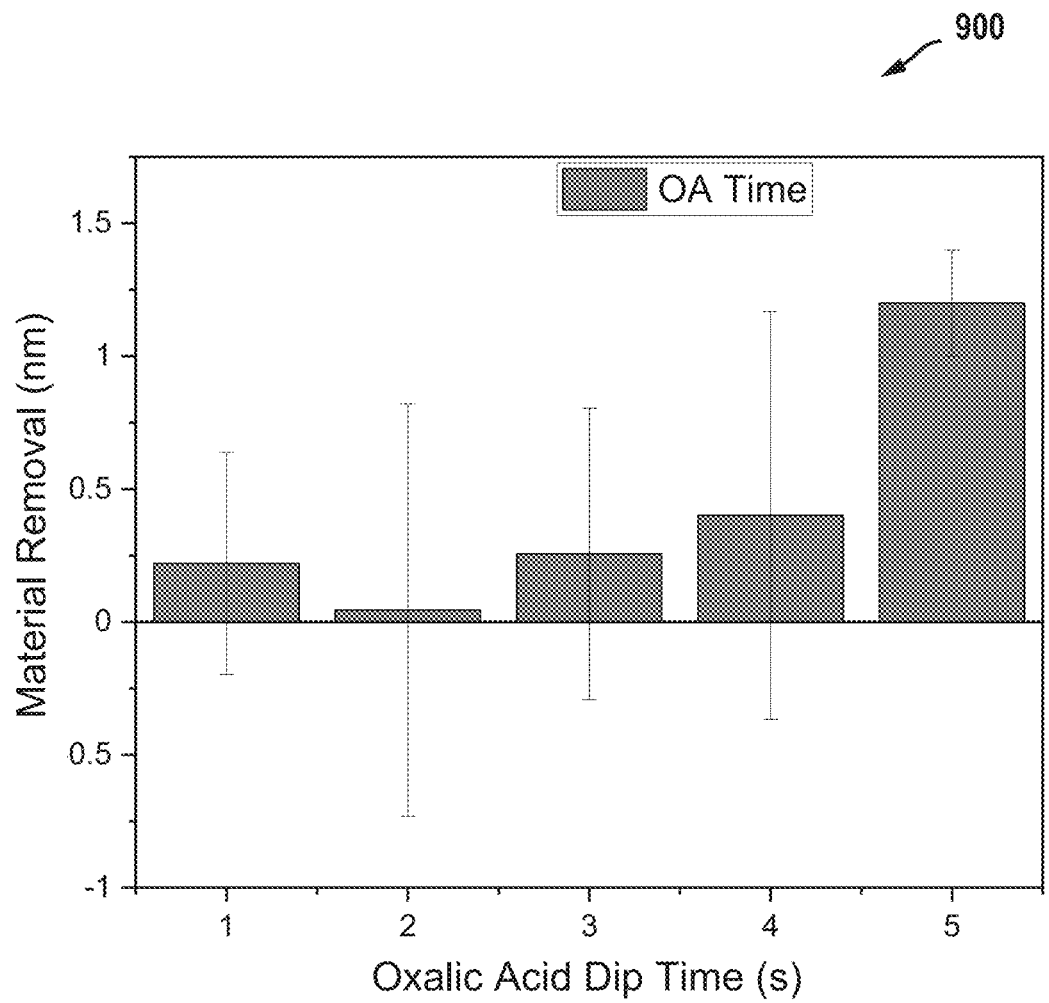
FIG. 9 is a graph of experimental results illustrating exemplary amounts of material removed (expressed in nm) as a function of complexation solution (e.g., oxalic acid) dip time (expressed in seconds, s) after 5 etch cycles.

As described above in reference to FIG. 1, the wet ALE process may generally begin by receiving a substrate having a copper metal layer 105 formed thereon, wherein an oxidized copper surface layer 115 of the copper metal layer 105 is exposed on a surface of the substrate. Next, the wet ALE process may expose the surface of the substrate to a complexation solution 125 containing a carboxylic acid dissolved in an organic solvent. In one example embodiment, the complexation solution 125 may comprise about 50 mM of oxalic acid ($C_2H_2O_2$) dissolved in isopropyl alcohol (IPA). The oxalic acid within the complexation solution 125 complexes the oxidized copper surface layer 115, which is present on the copper metal layer 105 as a copper oxide/hydroxide, to form a monolayer of copper oxalate. As shown in FIG. 9 and discussed in more detail below, this complexation reaction quickly forms a monolayer of copper oxalate after about 5 seconds. Thus, in one embodiment, the wet ALE process described herein may supply the complexation solution 125 to the surface of the substrate for approximately 5 seconds to ensure that at least one monolayer of copper oxalate is formed on the underlying copper metal layer 105.

After forming the copper oxalate layer, the substrate is rinsed with IPA for approximately 5 seconds to remove the complexation solution 125 from the surface of the substrate before exposing the surface of the substrate to a dilute aqueous ammonium hydroxide ($NH_4OH$) dissolution solution 145. To ensure the dissolution of the copper oxalate layer is self-limiting, the $NH_4OH$ concentration must be low enough (e.g., less than 10 mM) to not etch the underlying copper metal layer 105, but high enough to efficiently dissolve the copper oxalate layer. In one example embodiment, the dissolution solution 145 may comprise about 5 mM of ammonium hydroxide ($NH_4OH$) dissolved in deionized water (DI $H_2O$). After dissolving the copper oxalate layer, the substrate may again be rinsed with IPA for approximately 5 seconds to remove the dissolution solution 145 from the surface of the substrate. The etch cycle may then be repeated a number of times until a desired amount of the copper metal layer 105 is removed.

The etch rate per cycle for patterned substrates/wafers etched using the wet ALE process described herein was calculated from atomic force microscope (AFM) measurements to correspond to roughly the metallic diameter of one copper (Cu) atom, and therefore, about one monolayer of copper is etched per cycle. Further, using the cyclic wet ALE process described herein, approximately 2-4 nm of copper can be removed quickly without increasing the convexity of the etched copper feature or negatively impacting the roughness of the dielectric material 110 or the copper metal layer 105 itself. This is shown in the graphs presented in FIGS. 5-7 and discussed in more detail below.

The present disclosure contemplates a wide variety of etch chemistries that may be used within the complexation solution 125 and the dissolution solution 145 shown in FIG. 1. Example etch chemistries for etching copper using the wet ALE process disclosed herein are discussed in more detail below. Mixing of these solutions leads to a continuous etch process, loss of control of the etch and roughening of the pos-etch surface, all of which undermines the benefits of wet ALE. Thus, purge steps 140 and 160 are performed in the wet ALE process shown in FIG. 1 to prevent direct contact between the complexation solution 125 and the dissolution solution 145 on the substrate surface.

According to one embodiment of the present disclosure, the oxidized copper surface layer 115 is exposed to a complexation solution 125 of oxalic acid dissolved in IPA to form a copper oxalate layer on the unmodified copper metal layer 105 in the complexation step 100. According to other embodiments, oxalic acid may be replaced with another carboxylic acid in the complexation step 100. Any carboxylic acid that reacts with the oxidized copper surface layer 115 to form a corresponding copper carboxylate layer may be used, as long as the carboxylic acid is soluble in the first solvent (e.g., IPA) and the copper carboxylate layer is insoluble in the first solvent. For example, other carboxylic acids, such as mandelic acid, malic acid, maleic acid, or fumaric acid, may be utilized within the complexation solution 125 to form a corresponding copper carboxylate layer.

Although IPA is one example of a first solvent that may be used within the complexation solution 125 because of its extensive use and availability in the semiconductor industry, many other solvents work for this process. Examples of other organic solvents that may be used within the complexation solution 125 include diethyl ether (($C_2H_5$)$_2$O), acetonitrile ($C_2H_3N$), dimethyl sulfoxide ($C_2H_6OS$), as well as various alcohols (such as methanol, ethanol, amyl alcohol, and polyols), ketones (such as acetone and methyl ethyl ketone), and acetates. This list is illustrative, but not exhaustive. The only requirements for the first solvent are: (a) oxalic acid is soluble in the first solvent, (b) the copper oxalate layer formed during the complexation step 100 is insoluble in the first solvent, and (c) there is no reaction between the first solvent and metallic copper.

According to one embodiment of the present disclosure, the copper oxalate layer (or another copper carboxylate layer) formed during the complexation step 100 is selectively removed by exposing the surface of the substrate to a dissolution solution 145 of ammonium hydroxide ($NH_4OH$) dissolved in deionized water (DI $H_2O$). According to other embodiments, ammonium hydroxide may be replaced with another reactive agent that reacts with the copper oxalate layer (or another copper carboxylate layer) to form a soluble species. For example, bases such as potassium hydroxide (KOH), sodium hydroxide (NaOH), tetramethylammonium hydroxide (($CH_3$)$_4$NOH), potassium carbonate ($K_2CO_3$), ammonium carbonate (($NH_4$)$_2CO_3$) or any other weak base can be used in the dissolution solution 145.

Although deionized water (DI $H_2O$) is one example of an aqueous solvent that may be used within the dissolution solution 145, other solvents may be used. For example, some metal carboxylates are soluble in pure acetic acid as the solvent. The only requirements for the solvent used within the dissolution solution 145 are: (a) the copper oxalate layer (or another copper carboxylate layer) is soluble in the solvent, and (b) the solvent reacts with metallic copper to reoxidize exposed surfaces of the metallic copper to form a new oxidized copper surface layer 115.

Mixing a complexation solution 125 containing oxalic acid and a dissolution solution 145 containing ammonium hydroxide leads to a continuous etch process, loss of control of the etch, and roughening of the surface. Therefore, solvent rinse steps (i.e., purge steps 140 and 160) are performed between the complexation and dissolution steps to prevent direct contact between the two etch solutions on the copper surface. This includes fully rinsing the two solutions from small features, which may be formed on the patterned substrates. According to one embodiment of the present disclosure, the surface of the substrate may be rinsed within IPA. However, other solvents may be used for this purposes. For example, the surface of the substrate may be alternatively rinsed with other alcohols (such as methanol, ethanol, or amyl alcohol), acetates (such as ethyl acetate or amyl acetate), acetone or acetonitrile, in other embodiments.

Etch experiments were conducted using the preferred etch chemistry disclosed above on coupons cut from 300 mm silicon wafers containing a copper (Cu) metal layer deposited on one side. The different coupons contained different patterned areas of exposed copper metal. In particular, the coupons used in the etch experiments included a blanket coupon that was not patterned, a first patterned coupon containing 2 μm copper pads with a pitch of 3 μm, a second patterned coupon containing 0.5 μm copper pads with a pitch of 1 μm, and a third patterned coupon from a fully patterned wafer containing 0.5 μm copper pads with a pitch of 1 μm. The etch recipe used to etch the coupons included multiple wet ALE cycles, where each cycle included a 5 second dispense of a complexation solution 125 containing oxalic acid, a 5 second IPA rinse, a 5 second dispense of a dissolution solution 145 containing dilute ammonium hydroxide, and a 5 second IPA rinse.

Figure 2:
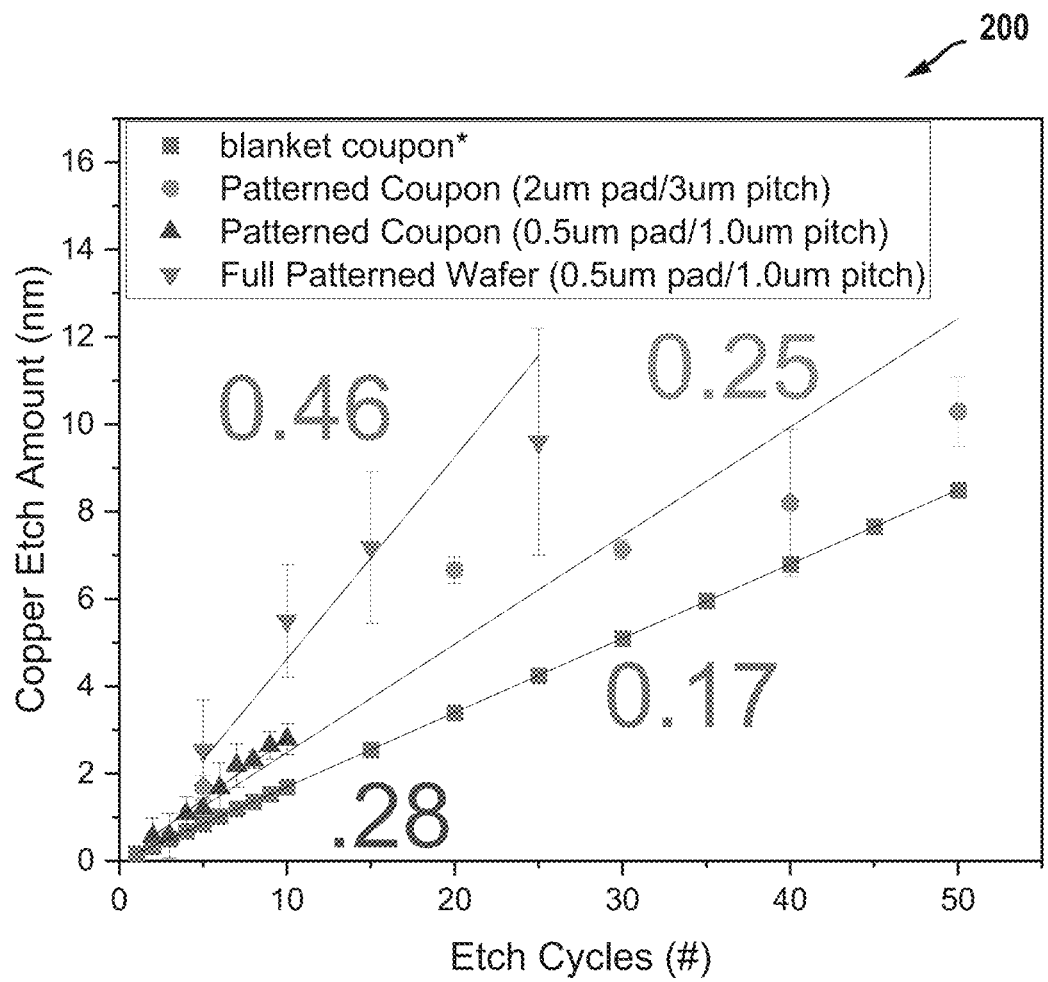
FIG. 2 is a graph of experimental results illustrating exemplary etch amounts (expressed in nanometers, nm) that may be achieved as a function of wet ALE cycle number when the wet ALE process shown in FIG. 1 is used to etch a copper metal layer on various patterned coupons.

The total etch amount (nm) as a function of wet ALE cycle number for the different coupons described above is illustrated in the graph 200 shown in FIG. 2. The linear etch amount behavior observed in FIG. 2 illustrates the ALE character and confirms an etch rate of about 0.28 nm/cycle between 2 and 10 cycles, which roughly corresponds to the diameter of one copper atom (0.26 nm) and one monolayer of copper per ALE cycle. These results hold for both larger and smaller pad sizes (2 μm and 0.5 μm) up to 50 ALE cycles. A relatively high etch rate of 0.46 nm/cycle for the fully patterned wafer was confirmed to be due to short purge times (e.g., 3 seconds) between the exposures. Other experiments with longer purge times (e.g., 5 seconds) resulted in about 0.25 nm/cycle for a fully patterned wafter.

Figure 3:
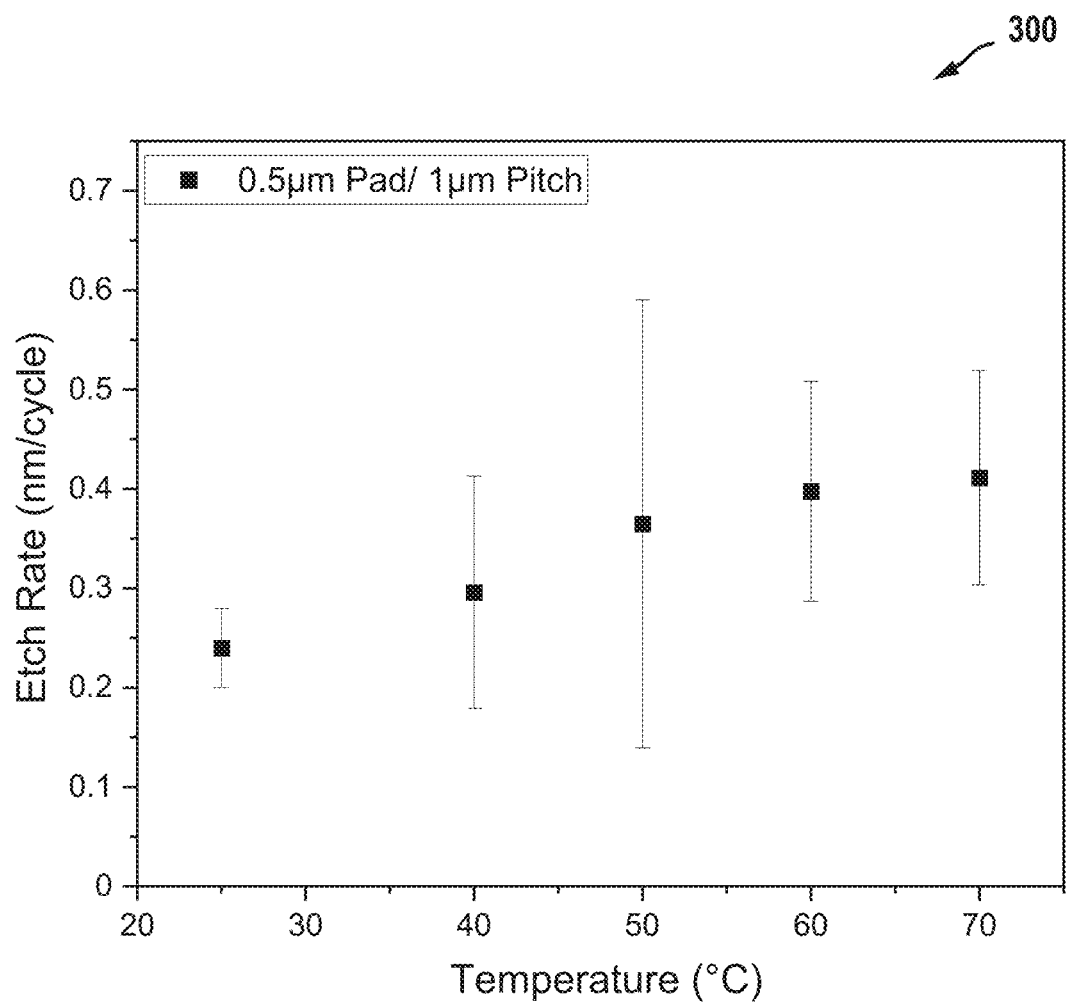
FIG. 3 is a graph of experimental results illustrating the effect of varying the temperature (expressed in ° C.) of the dissolution solution on the copper etch rate (expressed in nm/cycle) when the wet ALE process shown in FIG. 1 is used to etch a patterned coupon containing 0.5 μm Cu pads with a pitch of 1 μm.

The graph 300 in FIG. 3 shows the effect of varying the temperature (° C.) of the ammonium hydroxide dissolution solution on the copper etch rate (nm/cycle). As shown in FIG. 3, the etch rate increased by about 0.004 nm/cycle/° C. when the etch solution was heated from 25° C. to 70° C.

Figure 4:
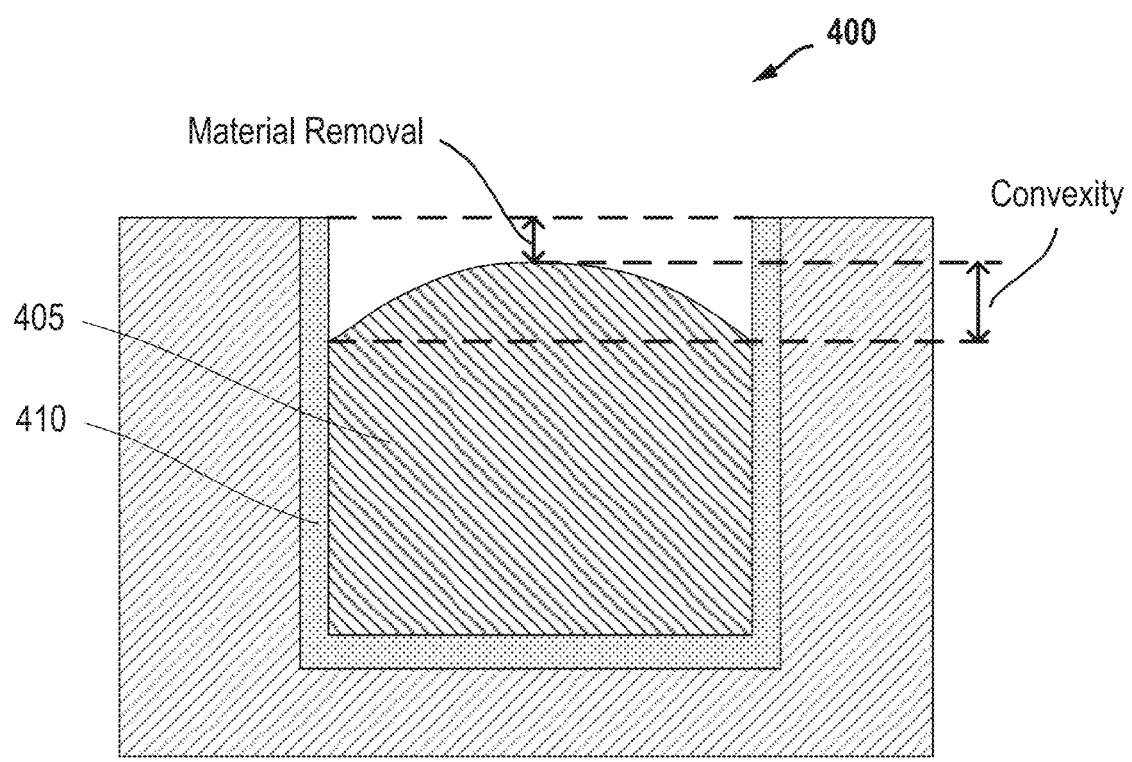
FIG. 4 is a schematic cross-sectional view of a copper filled recessed feature in a dielectric film, illustrating an amount of material removed and a convexity of the copper filled recessed feature.

Further etching experiments were conducted on substrates that contained copper filled recessed features in a silicon dioxide ($SiO_2$) film. FIG. 4 is a schematic cross-sectional view of a test sample 400 having a copper filled recessed feature 405 in a dielectric film 410 (e.g., a $SiO_2$ film, such as TEOS) and illustrates an amount of material removed during the etching experiments, as well as a convexity of the copper filled recessed feature 405 formed as a result of the etch. Convexity is a measure of the difference in the thickness of the copper filled recessed feature 405 between the center and edge of the feature. As shown in FIG. 4, the etch cycles removed copper metal from the recessed features; however the amount of copper removed varied from the center to the edge in the recessed features, resulting in a convex recessed feature.

Figure 5:
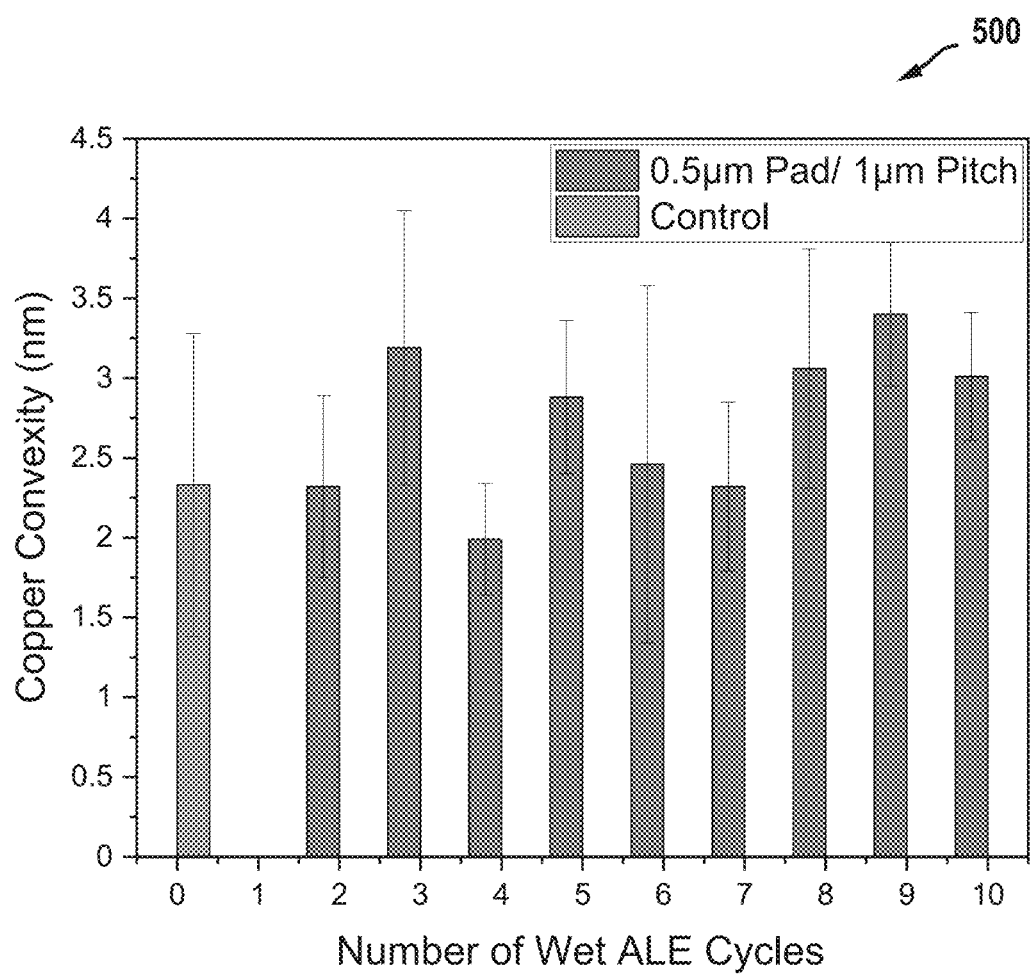
FIG. 5 is a graph of experimental results illustrating the copper convexity (expressed in nanometers, nm) achieved as a function of wet ALE cycles when the wet ALE process shown in FIG. 1 is used to etch a patterned coupon containing 0.5 μm Cu pads with a pitch of 1 μm.
Figure 6:
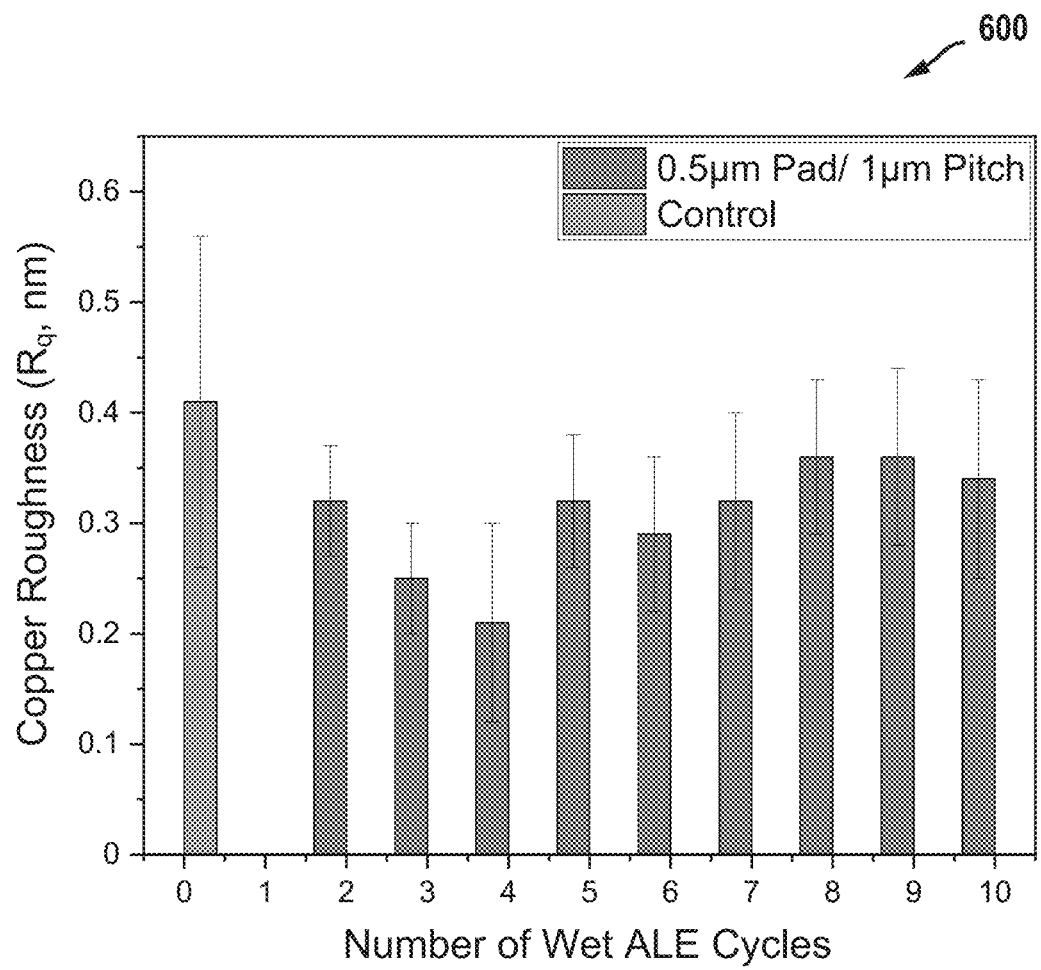
FIG. 6 is a graph of experimental results illustrating the copper roughness (expressed in $R_q$, nm) achieved as a function of wet ALE cycles when the wet ALE process shown in FIG. 1 is used to etch a patterned coupon containing 0.5 μm Cu pads with a pitch of 1 μm.
Figure 7:
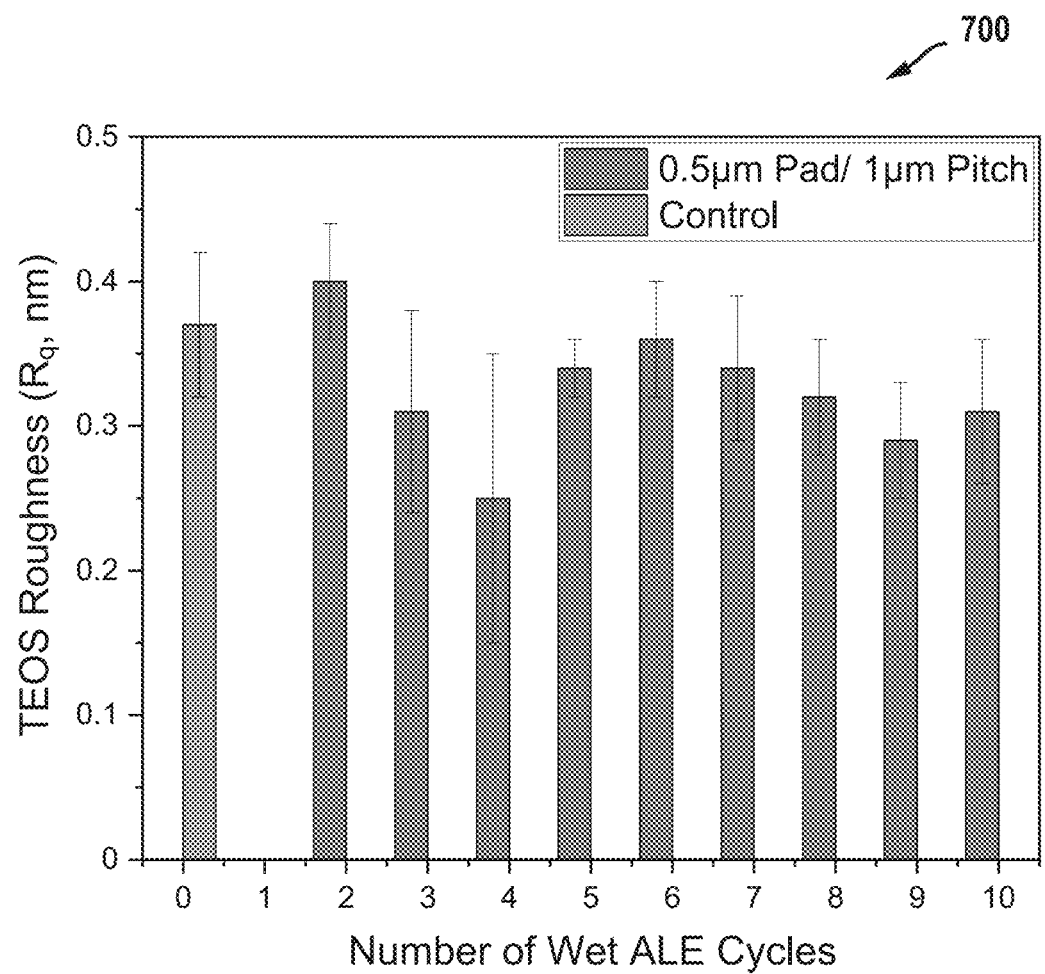
FIG. 7 is a graph of experimental results illustrating the dielectric (e.g., TEOS) roughness achieved as a function of wet ALE cycles when the wet ALE process shown in FIG. 1 is used to etch a patterned coupon containing 0.5 μm Cu pads with a pitch of 1 μm.

FIG. 5-7 shows experimental results obtained after performing a number of cycles (e.g., 10) of the wet ALE process described herein for patterned coupons containing 0.5 μm copper pads with a pitch of 1 μm. The graph 500 illustrated in FIG. 5 shows the copper convexity (expressed in nanometers, nm) achieved as a function of wet ALE cycles. The graph 600 illustrated in FIG. 6 shows the results for copper roughness (expressed in $R_q$, nm) achieved as a function of wet ALE cycles. The graph 700 illustrated in FIG. 7 shows the results for dielectric (e.g., a $SiO_2$ film, such as TEOS) roughness achieved as a function of wet ALE cycles. As shown in FIGS. 5-7, the experimental results showed no significant effect on copper convexity (FIG. 5), copper roughness (FIG. 6), and dielectric roughness (FIG. 7) for at least 10 wet ALE cycles. In addition to preventing surface roughness, the etch chemistry described herein and used to generate the experimental results did not remove the dielectric film.

Additional etch experiments were conducted to determine the effect of $NH_4OH$ concentration in DI $H_2O$ on etch selectivity between the copper oxalate layer and the underlying copper metal layer. During the etch experiments, selective copper oxalate removal was observed at a $NH_4OH$ concentration of 5 mM, and uncontrolled copper etching was observed at a $NH_4OH$ concentration of 50 mM. Further experiments using 10 mM concentration of $NH_4OH$ showed some pitting of the copper metal layer. Thus, according to one embodiment, the $NH_4OH$ concentration can be about 10 mM, or less, in order to avoid pitting. The experimental results showed that $NH_4OH$ must be used in relatively low concentrations (e.g., 10 mM or less) to ensure that it will etch and dissolve the copper oxalate layer, but not etch metallic copper or the new oxidized copper surface layer that is formed on the copper metal layer during the dissolution step when the copper oxalate layer is removed. This is a requirement for maintaining ALE of copper with good control over the etch rate.

Figure 8:
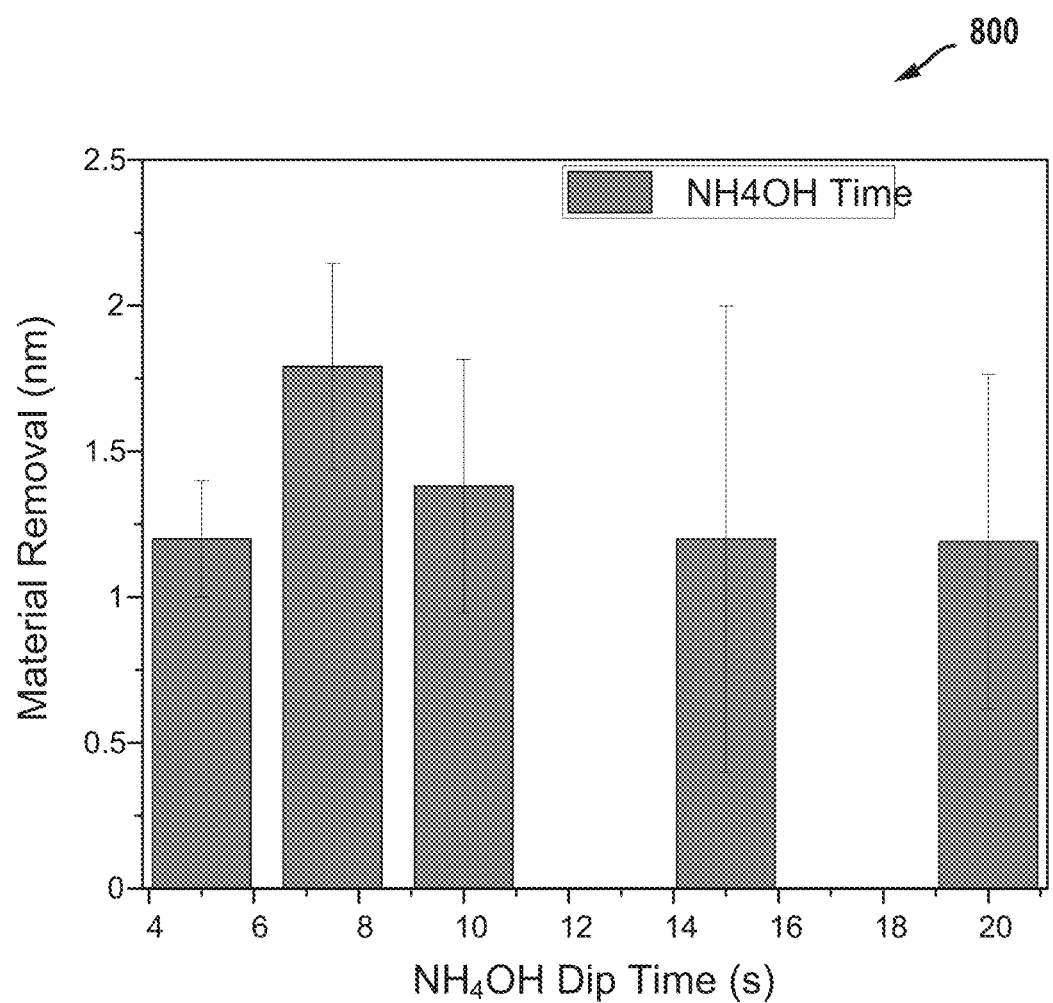
FIG. 8 is a graph of experimental results illustrating exemplary amounts of material removed (expressed in nm) as a function of dissolution solution (e.g., $NH_4OH$) dip time (expressed in seconds, s) after 5 etch cycles.

A graph 800 is provided in FIG. 8 illustrating exemplary amounts of material removed (expressed in nm) as a function of dissolution solution (e.g., $NH_4OH$) dip time (expressed in seconds) after 5 etch cycles. As shown in FIG. 8, at low $NH_4OH$ concentrations (e.g., 10 mM or less), the etch rate did not substantially increase with $NH_4OH$ dip time longer than about 5 seconds. This indicates that $NH_4OH$ selectively etches copper oxalate at these low $NH_4OH$ concentrations.

Figure 10:
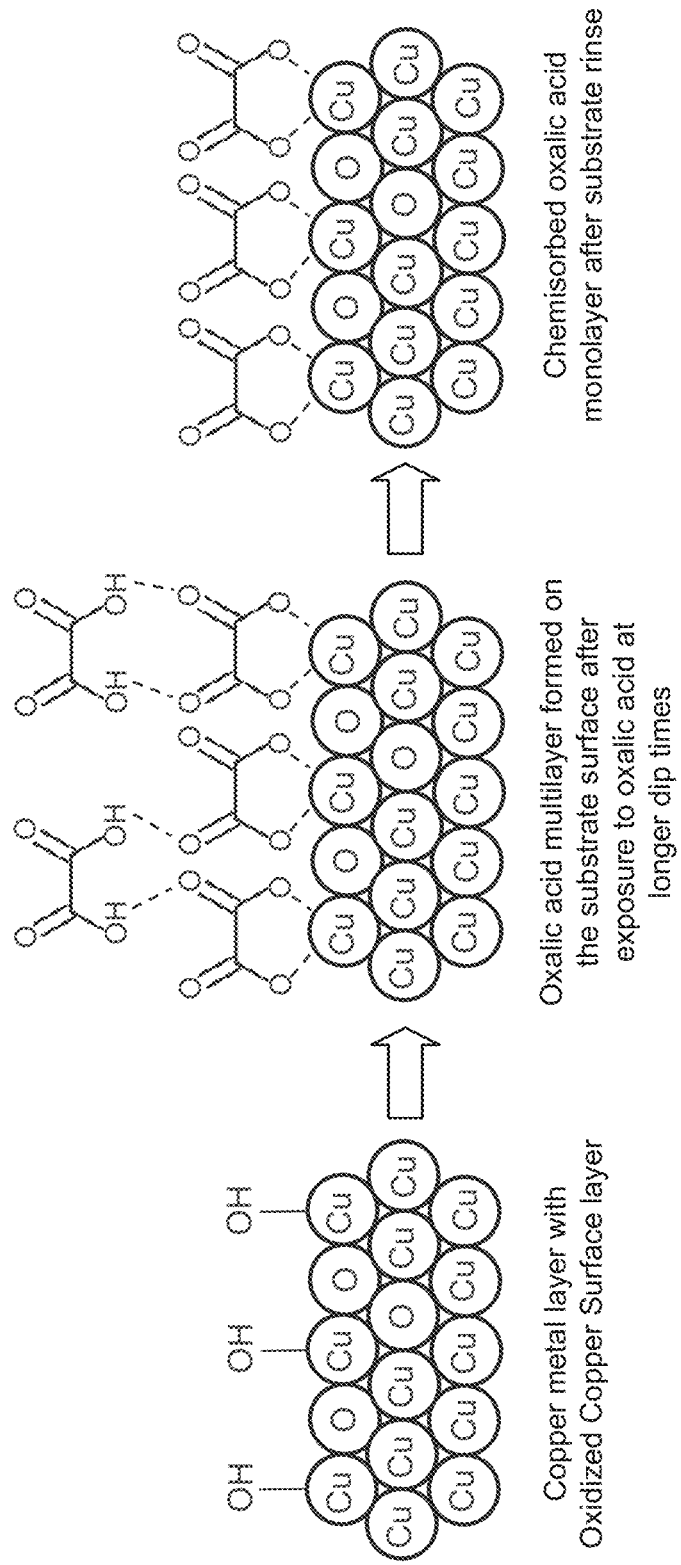
FIG. 10 is a schematic diagram illustrating the formation of a monolayer of oxalic acid chemisorbed to an oxidized copper surface layer.

A graph 900 is provided in FIG. 9 illustrating exemplary amounts of material removed (expressed in nm) as a function of complexation solution (e.g., oxalic acid) dip time (expressed in seconds) after 5 etch cycles. As shown in FIG. 9, a dip of at least 5 seconds in the complexation solution was needed to form a monolayer of oxalic acid on the substrate. If longer dip times are used, a multilayer of oxalic acid can form on the substrate through hydrogen bonding. This is due to the high ligand packing density of oxalic acid and is shown schematically in FIG. 10. According to one embodiment, an IPA rinsing step is performed after the oxalic acid exposure to remove any oxalic acid multilayer from the substrate surface, thereby forming only a chemisorbed monolayer of oxalic acid on the substrate surface, as shown in FIG. 10.

Figure 11A:
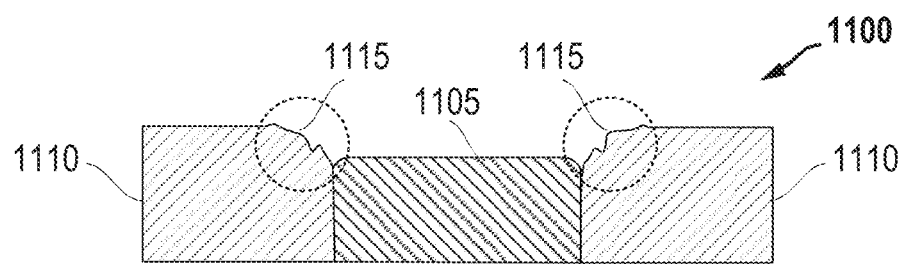
FIGS. 11A-11B illustrate common problems (e.g., seams and keyholes in the bonded wafers) encountered in a three-dimensional interconnect (3DI) hybrid bonding process when conventional etch techniques are used to recess a copper (Cu) metal feature within a dielectric layer.
Figure 11B:
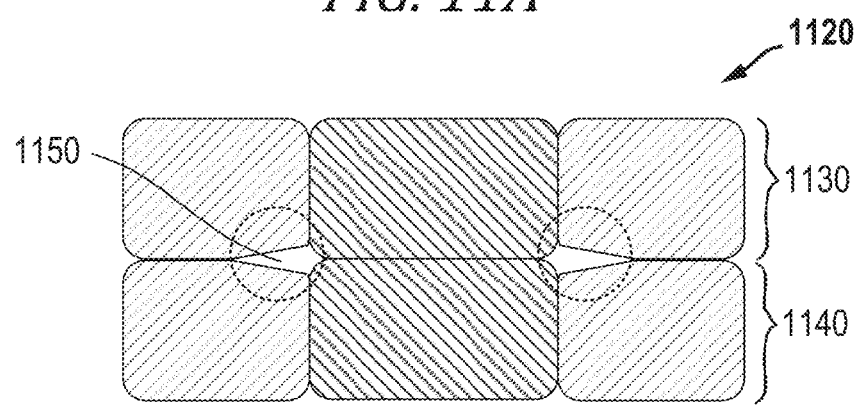

FIGS. 11A-11B illustrate common problems encountered in a three-dimensional interconnect (3DI) hybrid bonding process after conventional etch techniques have been used to recess a copper (Cu) metal feature within a dielectric layer. More specifically, FIG. 11A illustrates a cross-sectional view 1100 of a copper metal feature 1105 recessed within a dielectric layer 1110 using conventional wet etch techniques. FIG. 11B illustrates a 3DI hybrid bonding process 1120 in which a top wafer 1130 having an etched copper metal surface and a bottom wafer 1140 having an etched copper metal surface are bonded together, such that the etched copper metal surfaces face each other. As shown in FIGS. 11A and 11B, conventional etch methods provide a non-ideal etching profile 1115 (e.g., rough, rounded corners) due to poor etch selectivity between the dielectric layer 1110 (e.g., silicon dioxide, $SiO_2$) and the copper metal feature 1105. The non-ideal etch profile 1115 results in seams and keyholes 1150 at the bonded interface when the two wafers are bonded together using a heat-treatment. To avoid these problems, precise removal of about 2-5 nm of copper metal is needed, where the copper metal removal is selective to the dielectric material (such as, e.g., $SiO_2$) surrounding the copper metal.

Figure 12A:
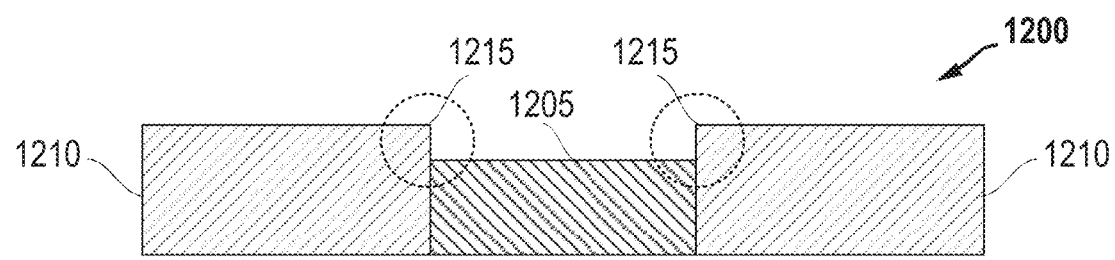
FIGS. 12A-12B show how the wet ALE process described herein for etching copper may be applied to a 3DI hybrid bonding process and utilized to eliminate seams and keyholes in the bonded wafers.
Figure 12B:
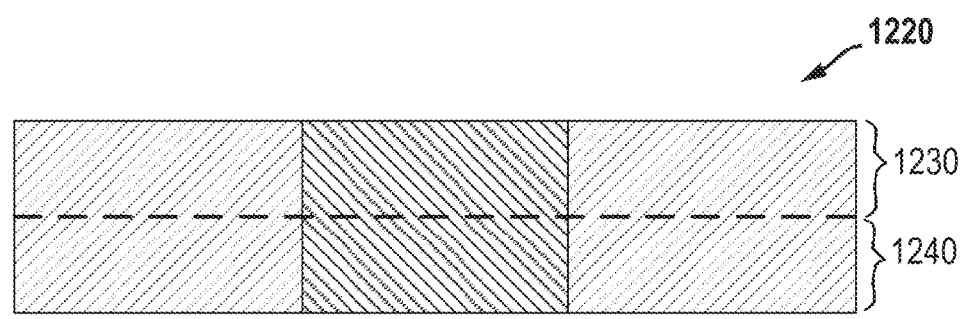

FIGS. 12A-12B show how the wet ALE process described herein for etching copper metal may be applied to a 3DI hybrid bonding process and utilized to eliminate seams and keyholes in the bonded wafers. More specifically, FIG. 12A illustrates a cross-sectional view 1200 of a copper metal feature 1205 recessed within a dielectric layer 1210 using the wet ALE techniques described herein. FIG. 12B illustrates a 3DI hybrid bonding process 1220 in which a top wafer 1230 having an etched copper metal surface and a bottom wafer 1240 having an etched copper metal surface are bonded together, such that the etched copper metal surfaces face each other. A selective copper etching process is used in FIG. 12A for recessing the copper metal feature 1205 below a top surface of the dielectric layer 1210. The wet ALE process described above may be used to provide the selective Cu etching shown in FIG. 12A. In FIG. 12B, two wafers with recessed copper metal features 1205 are bonded together using a heat treatment that reflows the copper metal. As shown in FIGS. 12A-12B, the wet ALE process described herein provides good etch selectivity between the dielectric layer 1210 (e.g., silicon dioxide, $SiO_2$) and the copper metal feature 1205, and thus, provides an ideal etch profile 1215 that eliminates seams and keyholes at the bonded interface when the two wafers are bonded together.

As noted above, the wet ALE process described herein enables copper metal to be removed with atomic layer precision. In one embodiment, the wet ALE process described herein may be used to provide precise removal of about 2-5 nm of copper metal. The precise removal of 2-5 nm of copper metal allows for the required wafer-to-wafer etch uniformity needed for high-volume semiconductor manufacturing of bonded interconnects. The wet ALE process described herein also provides precise within-wafer etch copper metal recess depth and recess depth uniformity, which allows for creating good Cu/Cu contacts using a low thermal budget during the heat-treatment portion of the 3DI hybrid bonding process. Other requirements of the 3DI hybrid bonding process include minimal damage to a surface of the dielectric, minimal increase in dielectric surface roughness, and minimal dielectric corner rounding to avoid formation of voids after the wafer bonding process. Further, the copper metal removal process used in the bonding process preferably uses non-corrosive chemistry, and process chamber contamination by volatile copper-containing reaction products should be minimized. The wet ALE process described herein for etching copper fulfills all these requirements.

Figure 13A:
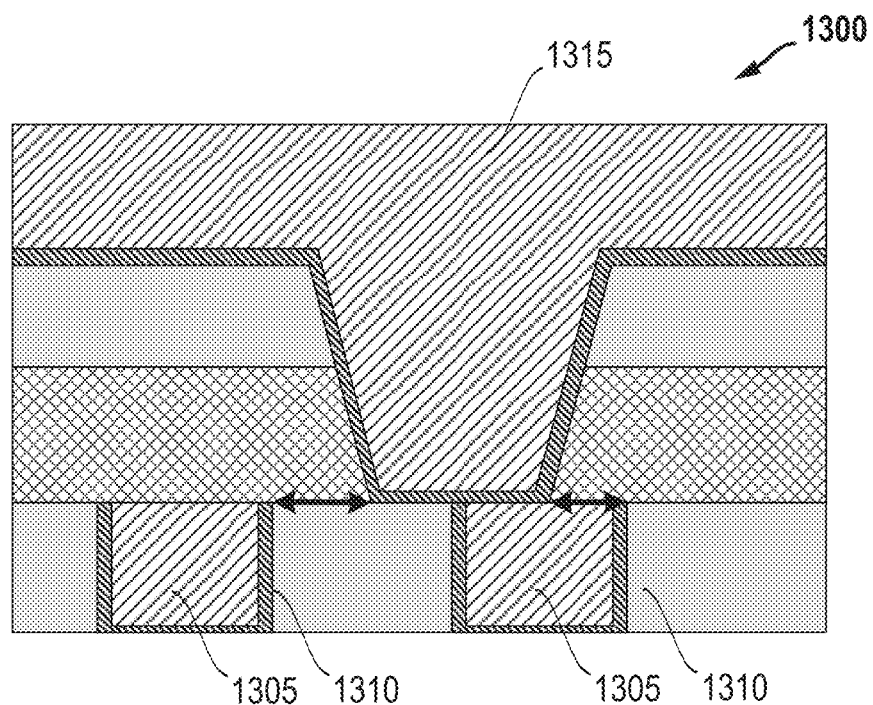
FIGS. 13A-13B illustrate common problems encountered in a fully self-aligned via (FSAV) processes.
Figure 13B:
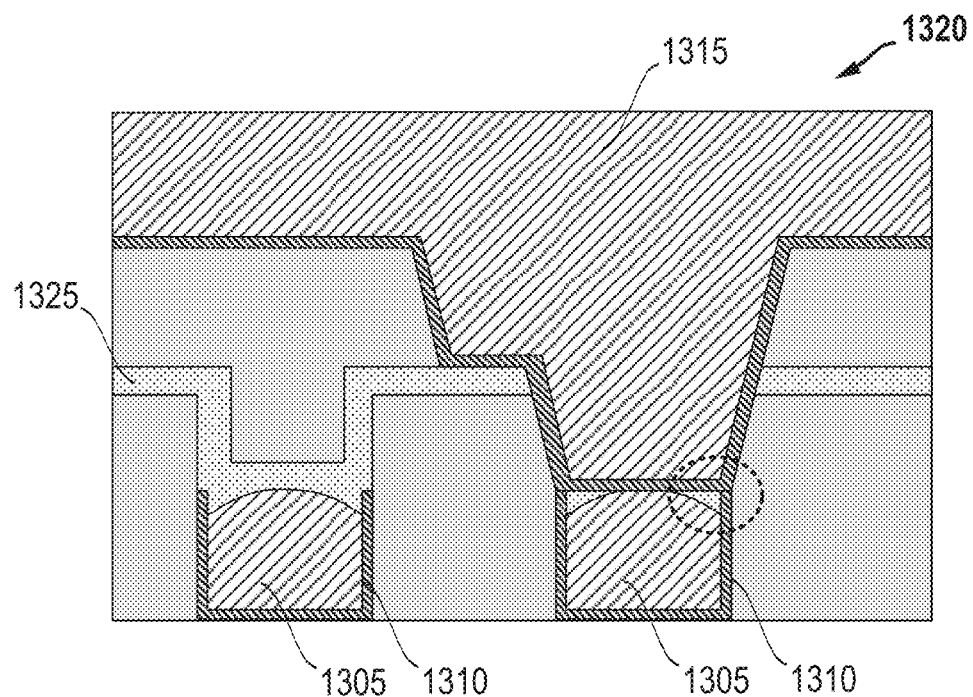

FIGS. 13A and 13B illustrate common problems encountered in a fully self-aligned via (FSAV) process. More specifically, FIG. 13A shows a schematic cross-sectional view of a FSAV 1300 where a replacement error between a copper metal feature 1305 (e.g., a copper filled via) and a copper metal line 1315 leads to poor via-line distance when a copper metal etch back process is not performed. FIG. 13B shows a schematic cross-sectional view of a FSAV 1320 in which conventional etch techniques have been used to etch back or recess the copper metal feature 1305 within the dielectric layer 1310 and an etch stop material 1325 has been formed. As shown in FIG. 13B, etch stop material 1325 is present at the line edge when conventional etch techniques are utilized because the etched copper metal feature 1305 is too convex.

Figure 13C:
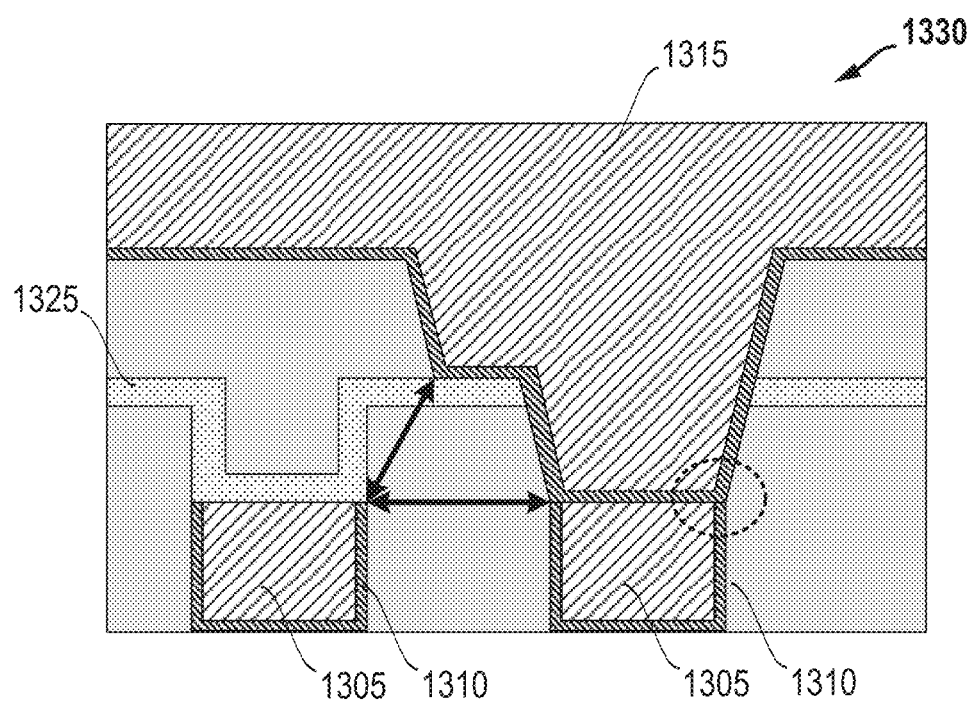
FIG. 13C shows how the wet ALE process described herein for etching copper may be applied to a fully self-aligned via (FSAV) process.

FIG. 13C illustrates how the wet ALE process described herein for etching copper may be applied to a fully self-aligned via (FSAV) process. More specifically, FIG. 13C shows a schematic cross-sectional view of a FSAV 1330 with ideal via-line distance and surface profile after a selective copper etching process according to embodiments of the present disclosure has been used to etch back or recess the copper metal feature 1305 within the dielectric layer 1310. The wet ALE process described above may be used to provide the selective copper etching process shown in FIG. 13C for recessing the copper metal feature 1305 below a top surface of the dielectric layer 1310. In one embodiment, the wet ALE process described herein may be used to provide precise removal of about 7-10 nm of copper metal, where such removal is selective to low-k dielectrics. This recess is necessary to reduce the effect of replacement errors (as shown in FIG. 13A) and allows for the patterning of large vias. As noted above, the selective copper etching process described herein provides minimal damage to dielectric or copper surface roughness and shape, avoids corner rounding of the dielectric material (which would shorten the distance between the copper metal lines), and avoids increasing copper surface convexity (which would lead to subsequent etch non-uniformities and reliability concerns).

The wet ALE process described herein for etching copper can be accomplished using a variety of techniques. For example, the wet ALE process disclosed above may be performed by dipping a substrate having copper metal features formed thereon in beakers of each etch solution. In this case, purging can be accomplished by either rinsing or dipping the substrate in an appropriate solvent bath. The wet ALE process disclosed above may also be performed within a wide variety of semiconductor processing systems. While the wet ALE process can be accomplished using many different process chambers, tools and apparatuses, the processing equipment used to perform the wet ALE process is preferably capable of running at (or near) room temperature and at (or near) atmospheric pressure.

In one example implementation, the wet ALE process described herein may be performed within a spin chamber. When a spin chamber is utilized, etch solutions are dispensed from a nozzle positioned over the substrate and are distributed by the rotational motion of a spin chuck on which the substrate is disposed. After the set exposure time, the nozzle begins dispensing the next solution in the etch recipe. This process continues through the whole etch cycle and repeats for as many cycles as necessary to remove the desired amount of metal. For high volume manufacturing, dispensing of etch solutions and rinses can be executed using conventional tools, such as wet etching tools and rinse tools.

Figure 14:
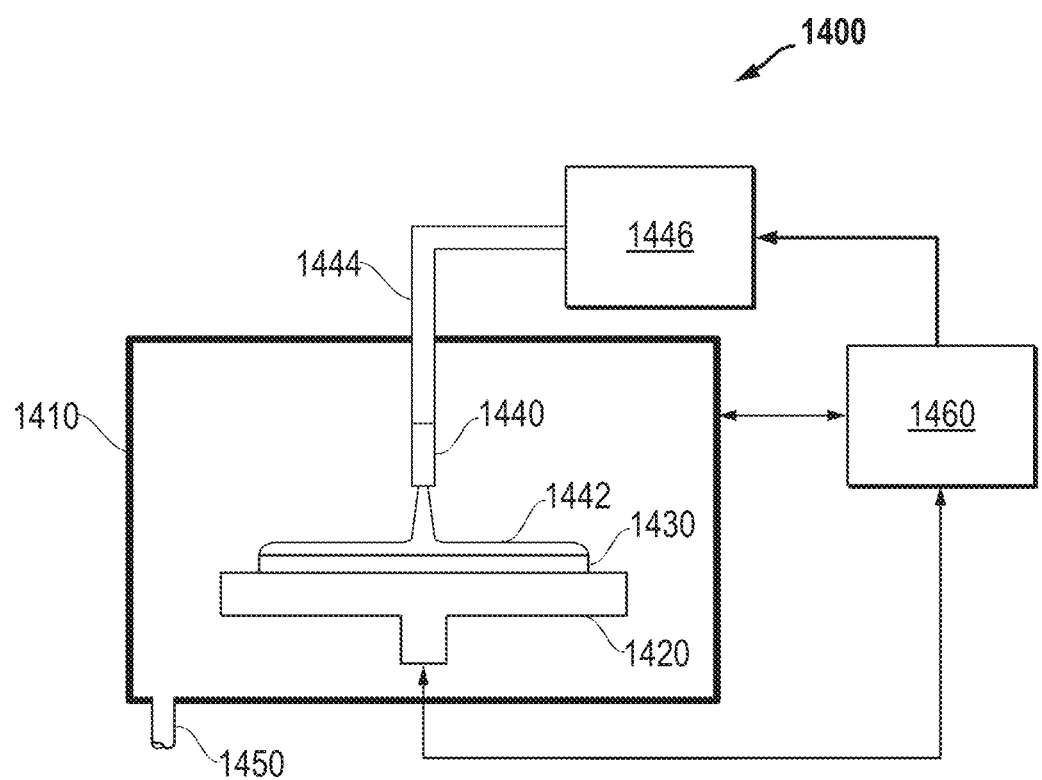
FIG. 14 is a block diagram of an example processing system that can use the techniques described herein to etch a copper metal layer.

FIG. 14 illustrates one embodiment of a processing system 1400 that may use the techniques described herein to etch a copper metal layer on a surface of a substrate 1430. As shown in FIG. 14, the processing system 1400 includes a process chamber 1410, which in some embodiments, may be a pressure controlled chamber. In the embodiment shown in FIG. 14, the process chamber 1410 is a spin chamber having a spinner 1420 (or spin chuck), which is configured to spin or rotate at a rotational speed. A substrate 1430 is held on the spinner 1420, for example, via electrostatic force or vacuum pressure. In one example, the substrate 1430 may be a semiconductor wafer having a copper metal layer formed on or within the substrate 1430.

The processing system 1400 shown in FIG. 14 further includes a liquid nozzle 1440, which is positioned over the substrate 1430 for dispensing various etch solutions 1442 onto a surface of the substrate 1430. The etch solutions 1442 dispensed onto the surface of the substrate 830 may generally include a complexation solution that includes a complexing agent (e.g., a carboxylic-based ligand), which binds to an oxidized copper metal surface layer to form a ligand-metal complex (e.g., a copper carboxylate layer), and a dissolution solution to selectively remove the ligand-metal complex. Purge solutions may also be dispensed onto the surface of the substrate 1430 between the complexation and dissolution steps to separate the complexation and dissolution solutions. Examples of complexation, dissolution and purge solutions are discussed above.

As shown in FIG. 14, the etch solutions 1442 may be stored within a chemical supply system 1446, which may include one or more reservoirs for holding the various etch solutions 1442 and a chemical injection manifold, which is fluidly coupled to the process chamber 1410 via a liquid supply line 1444. In operation, the chemical supply system 1446 may selectively apply desired chemicals to the process chamber 1410 via the liquid supply line 1444 and the liquid nozzle 1440 positioned within the process chamber 1410. Thus, the chemical supply system 1446 can be used to dispense the etch solutions 1442 onto the surface of the substrate 1430. The process chamber 1410 may further include a drain 1450 for removing the etch solutions 1442 from the process chamber 1410.

Components of the processing system 1400 can be coupled to, and controlled by, a controller 1460, which in turn, can be coupled to a corresponding memory storage unit and user interface (not shown). Various processing operations can be executed via the user interface, and various processing recipes and operations can be stored in the memory storage unit. Accordingly, a given substrate 1430 can be processed within the process chamber 1410 in accordance with a particular recipe. In some embodiments, a given substrate 1430 can be processed within the process chamber 1410 in accordance with an etch recipe that utilizes the wet ALE techniques described herein for etching copper.

The controller 1460 shown in block diagram form in FIG. 14 can be implemented in a wide variety of manners. In one example, the controller 1460 may be a computer. In another example, the controller 1460 may include one or more programmable integrated circuits that are programmed to provide the functionality described herein. For example, one or more processors (e.g., microprocessor, microcontroller, central processing unit, etc.), programmable logic devices (e.g., complex programmable logic device (CPLD), field programmable gate array (FPGA), etc.), and/or other programmable integrated circuits can be programmed with software or other programming instructions to implement the functionality of a prescribed plasma process recipe. It is further noted that the software or other programming instructions can be stored in one or more non-transitory computer-readable mediums (e.g., memory storage devices, flash memory, dynamic random access memory (DRAM), reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

As shown in FIG. 14, the controller 1460 may be coupled to various components of the processing system 1400 to receive inputs from, and provide outputs to, the components. For example, the controller 1460 may be coupled to: the process chamber 1410 for controlling the temperature and/or pressure within the process chamber 1410; the spinner 1420 for controlling the rotational speed of the spinner 1420; and the chemical supply system 1446 for controlling the various etch solutions 1442 dispensed onto the substrate 1430. The controller 1460 may control other processing system components not shown in FIG. 14, as is known in the art.

In some embodiments, the controller 1460 may control the various components of the processing system 1400 in accordance with an etch recipe that utilizes the wet ALE techniques described herein for etching copper. For example, the controller 1460 may supply various control signals to the chemical supply system 1446, which cause the chemical supply system 1446 to: a) dispense a complexation solution onto the surface of the substrate 1430 to bind a complexing agent to the oxidized copper surface layer and form a complex-bound oxidized copper surface layer (e.g., a ligand-metal complex) on the copper metal layer; b) rinse the substrate 1430 with a first purge solution to remove to remove the complexation solution 125 and any excess reactants from the surface of the substrate 1430; c) dispense a dissolution solution onto the surface of the substrate 1430 to selectively remove or dissolve the complex-bound oxidized copper surface layer from the copper metal layer and form a new oxidized copper surface layer on the copper metal layer; and d) rinse the substrate with a second purge solution to remove the dissolution solution from the surface of the substrate 1430. In some embodiments, the controller 1460 may supply the control signals to the chemical supply system 1446 in a cyclic manner, such that the steps a)-d) are repeated for one or more ALE cycles, until a desired amount of the copper metal has been removed.

In some embodiments, the controller 1460 may control the temperature and/or the pressure within the process chamber 1410. In some embodiments, the complexation, dissolution and purge steps of the wet ALE process described herein may be performed at roughly the same temperature and pressure. In one example implementation, the complexation, dissolution and purge steps may each be performed at (or near) atmospheric pressure and room temperature. Performing the processing steps within the same process chamber at roughly the same temperature and pressure decreases the cycle time and improves the throughput of the wet ALE process described herein by avoiding unnecessary chamber transitions and temperature/pressure changes.

It is noted, however, that the embodiments described herein are not strictly limited to only atmospheric pressure and room temperature, nor are they limited to a particular process chamber. In other embodiments, one or more of the complexation, dissolution and purge steps can be run at above atmospheric pressure in a pressure vessel, or at reduced pressure in a vacuum chamber. Etch solutions can be dispensed in these environments as long as the vapor pressure of the liquid is lower than the chamber pressure. For these implementations, a spinner with a liquid dispensing nozzle would be placed in the pressure vessel or vacuum chamber. The temperature of the liquid being dispensed can be elevated to any temperature below its boiling point at the pressure of the process. In one example implementation, the dissolution step may be performed at a temperature between 25° C. and 70° C. as shown in FIG. 3. As shown, higher liquid temperatures can be used to increase the etch rate.

Figure 15:
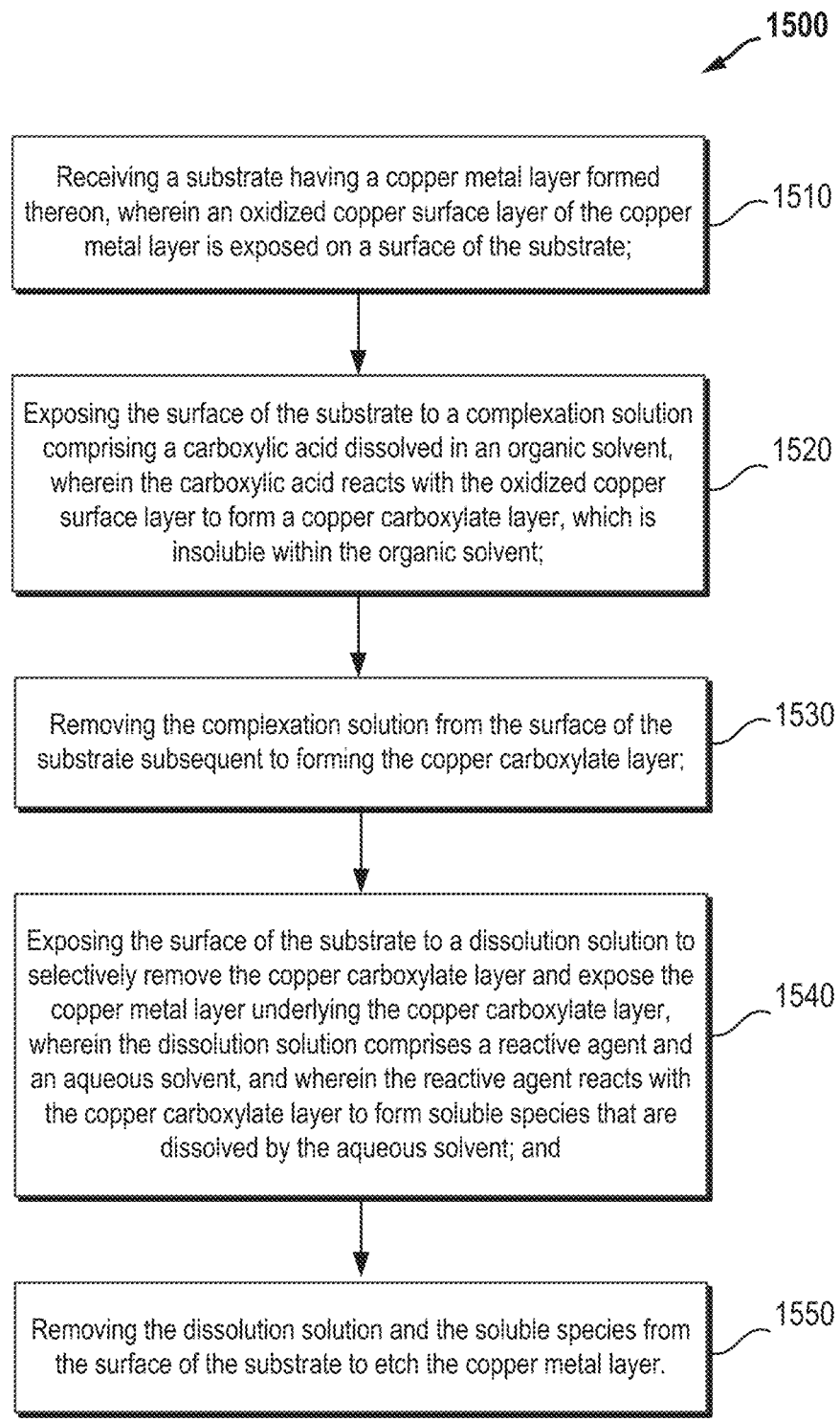
FIG. 15 is a flowchart diagram illustrating one embodiment of a method utilizing the techniques described herein.
Figure 16:
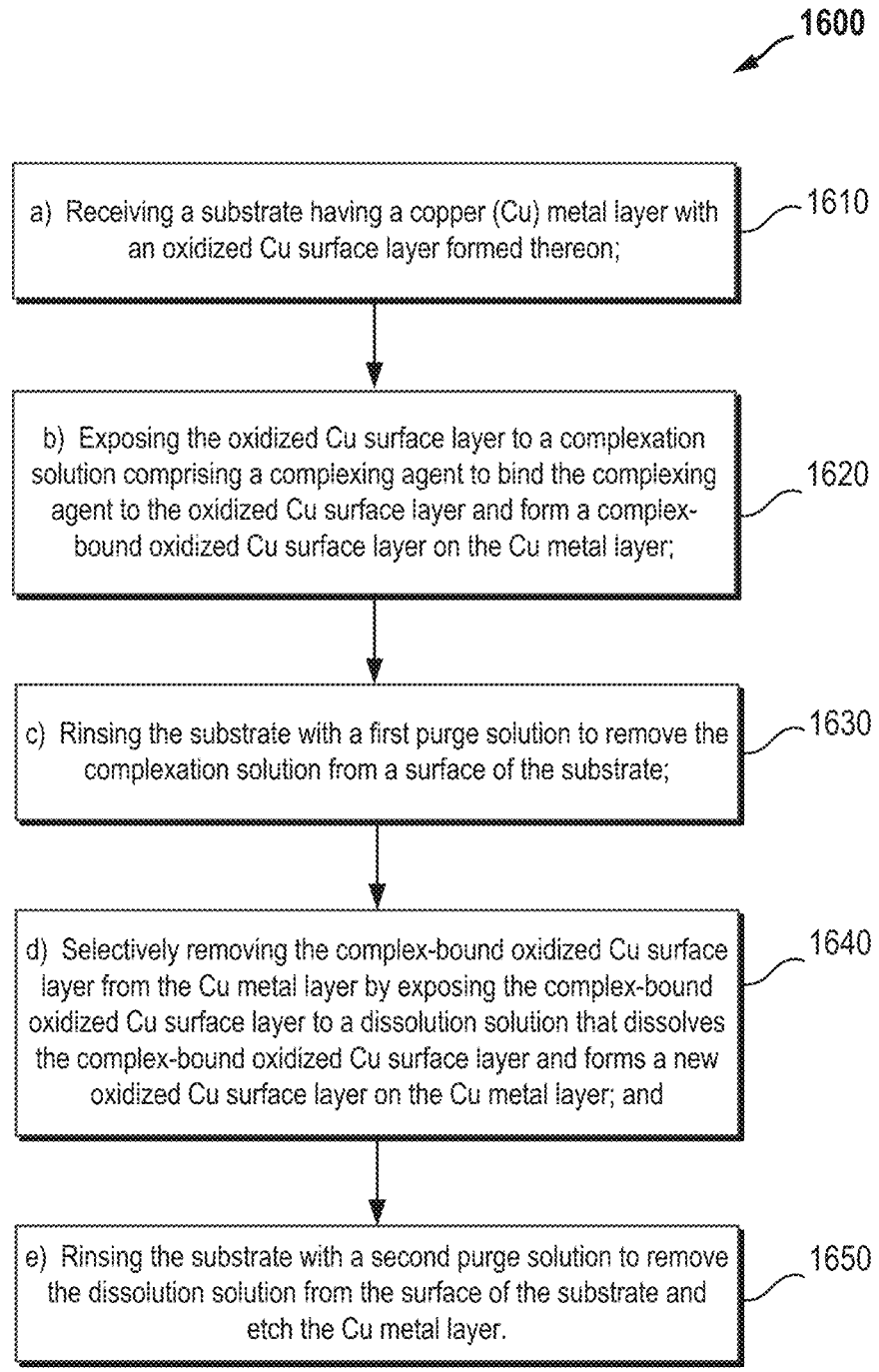
FIG. 16 is a flowchart diagram illustrating another embodiment of a method utilizing the techniques described herein.

FIGS. 15-16 illustrate exemplary methods that utilize the new etch chemistries described herein for etching copper in a wet ALE process. It will be recognized that the embodiments of FIGS. 15-16 are merely exemplary and additional methods may utilize the techniques described herein. Further, additional processing steps may be added to the methods shown in the FIGS. 15-16 as the steps described are not intended to be exclusive. Moreover, the order of the steps is not limited to the order shown in the figures as different orders may occur and/or various steps may be performed in combination or at the same time.

FIG. 15 illustrates one embodiment of a method 1500 of etching. The method 1500 shown in FIG. 15 may generally begin (in step 1510) by receiving a substrate having a copper metal layer formed thereon, wherein an oxidized copper surface layer of the copper metal layer is exposed on a surface of the substrate. Next, the method 1500 may include exposing the surface of the substrate to a complexation solution comprising a carboxylic acid dissolved in an organic solvent (in step 1520). The carboxylic acid may react with the oxidized copper surface layer to form a copper carboxylate layer, which is insoluble within the organic solvent. Next, the method 1500 may include removing the complexation solution from the surface of the substrate subsequent to forming the copper carboxylate layer (in step 1530), and exposing the surface of the substrate to a dissolution solution to selectively remove the copper carboxylate layer and expose the copper metal layer underlying the copper carboxylate layer (in step 1540). The dissolution solution may generally include a reactive agent and an aqueous solvent. The reactive agent may react with the copper carboxylate layer to form soluble species, which are dissolved by the aqueous solvent. Next, the method 1500 may include removing the dissolution solution and the soluble species from the surface of the substrate to etch the copper metal layer (in step 1550). In some embodiments, the method 1500 may further include repeating the steps of exposing the surface of the substrate to the complexation solution, removing the complexation solution, exposing the surface of the substrate to the dissolution solution, and removing the dissolution solution a number of cycles until a predetermined amount of the copper metal is removed from the substrate.

FIG. 16 illustrates one embodiment of a method 1600 that may be used for etching copper using a wet atomic layer etching (ALE) process. The method 1600 shown in FIG. 16 may generally include: a) receiving a substrate having a copper (Cu) metal layer with an oxidized Cu surface layer formed thereon (in step 1610); b) exposing the oxidized Cu surface layer to a complexation solution comprising a complexing agent to bind the complexing agent to the oxidized Cu surface layer and form a complex-bound oxidized Cu surface layer on the Cu metal layer (in step 1620); c) rinsing the substrate with a first purge solution to remove the complexation solution from a surface of the substrate (in step 1630); d) selectively removing the complex-bound oxidized Cu surface layer from the Cu metal layer by exposing the complex-bound oxidized Cu surface layer to a dissolution solution that dissolves the complex-bound oxidized Cu surface layer and forms a new oxidized Cu surface layer on the Cu metal layer (in step 1640); and e) rinsing the substrate with a second purge solution to remove the dissolution solution from the surface of the substrate and etch the Cu metal layer (in step 1650). In one embodiment, the method may further include repeating steps b)-e) at least once to further etch the Cu metal layer. In one example, the complexing agent may include oxalic acid and the dissolution solution may contain ammonium hydroxide dissolved in an aqueous solvent.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a substrate are described in various embodiments. The substrate may include any material portion or structure of a device, particularly a semiconductor or other electronics device, and may, for example, be a base substrate structure, such as a semiconductor substrate or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the wet ALE techniques for etching copper are described herein with reference to specific embodiments, various modifications and changes can be made without departing from the scope of the present disclosure. Accordingly, the specification and figures are to be regarded in an illustrative rather than a restrictive sense, and such modifications are intended to be included within the scope of the present disclosure. Further, any benefits, advantages, or solutions to problems that are described herein with regard to specific embodiments are not intended to be construed as a critical, required, or essential feature or element of any or all the claims.

What is claimed is:

1. A method of etching, the method comprising:
receiving a substrate having a copper metal layer formed thereon, wherein an oxidized copper surface layer of the copper metal layer is exposed on a surface of the substrate;
exposing the surface of the substrate to a complexation solution comprising a carboxylic acid dissolved in an organic solvent, wherein the carboxylic acid reacts with the oxidized copper surface layer to form a copper carboxylate layer, which is insoluble within the organic solvent;
removing the complexation solution from the surface of the substrate subsequent to forming the copper carboxylate layer;
exposing the surface of the substrate to a dissolution solution to selectively remove the copper carboxylate layer and expose the copper metal layer underlying the copper carboxylate layer, wherein the dissolution solution comprises a reactive agent and an aqueous solvent, and wherein the reactive agent reacts with the copper carboxylate layer to form soluble species that are dissolved by the aqueous solvent; and
removing the dissolution solution and the soluble species from the surface of the substrate to etch the copper metal layer.

2. The method of claim 1, further comprising repeating the steps of exposing the surface of the substrate to the complexation solution, removing the complexation solution, exposing the surface of the substrate to the dissolution solution, and removing the dissolution solution a number of cycles until a predetermined amount of the copper metal layer is removed from the substrate.

3. The method of claim 1, wherein the carboxylic acid is oxalic acid, mandelic acid, malic acid, maleic acid or fumaric acid.

4. The method of claim 1, wherein the organic solvent is isopropyl alcohol (IPA) or another alcohol, diethyl ether (($C_2H_5$)$_2$O), acetonitrile ($C_2H_3N$), dimethyl sulfoxide ($C_2H_6OS$), a ketone or an acetate.

5. The method of claim 1, wherein the carboxylic acid is oxalic acid, wherein the organic solvent is isopropyl alcohol (IPA), and wherein the oxalic acid reacts with the oxidized copper surface layer to form a copper oxalate layer, which is insoluble within IPA, but soluble with the aqueous solvent included within the dissolution solution.

6. The method of claim 1, wherein said exposing the surface of the substrate to the complexation solution comprises supplying the complexation solution to the surface of the substrate for a period of time needed to form at least one monolayer of the copper carboxylate layer on the underlying copper metal layer.

7. The method of claim 6, wherein the carboxylic acid is oxalic acid, and wherein the complexation solution is supplied to the surface of the substrate for at least 5 seconds to form at least one monolayer of copper oxalate on the underlying copper metal layer.

8. The method of claim 1, wherein the reactive agent within the dissolution solution is a base.

9. The method of claim 1, wherein the reactive agent within the dissolution solution is ammonium hydroxide ($NH_4OH$).

10. The method of claim 1, wherein after selectively removing the copper carboxylate layer and exposing the underlying copper metal layer, the dissolution solution re-oxidizes an exposed surface of the underlying copper metal layer to form a new oxidized copper surface layer.

11. The method of claim 10, wherein the dissolution solution does not etch the underlying copper metal layer or the new oxidized copper surface layer.

12. The method of claim 10, wherein the dissolution solution contains aqueous ammonium hydroxide ($NH_4OH$), and wherein a concentration of the ammonium hydroxide in the dissolution solution is maintained below a level that etches the underlying copper metal layer or the new oxidized copper surface layer after selectively removing the copper carboxylate layer.

13. The method of claim 1, wherein said removing the complexation solution and said removing the dissolution solution each comprise rinsing the surface of the substrate with a purge solution to remove excess reactants from the surface of the substrate and prevent the complexation solution and the dissolution solution from mixing.

14. A method of etching copper using a wet atomic layer etching (ALE) process, the method comprising:
 a) receiving a substrate having a copper (Cu) metal layer with an oxidized Cu surface layer formed thereon;
 b) exposing the oxidized Cu surface layer to a complexation solution comprising a complexing agent to bind the complexing agent to the oxidized Cu surface layer and form a complex-bound oxidized Cu surface layer on the Cu metal layer;
 c) rinsing the substrate with a first purge solution to remove the complexation solution from a surface of the substrate;
 d) selectively removing the complex-bound oxidized Cu surface layer from the Cu metal layer by exposing the complex-bound oxidized Cu surface layer to a dissolution solution that dissolves the complex-bound oxidized Cu surface layer and forms a new oxidized Cu surface layer on the Cu metal layer; and
 e) rinsing the substrate with a second purge solution to remove the dissolution solution from the surface of the substrate and etch the Cu metal layer.

15. The method of claim 14, wherein steps b) and d) have no temporal overlap.

16. The method of claim 14, further comprising repeating steps b)-e) at least once to further etch the Cu metal layer.

17. The method of claim 14, wherein the dissolution solution contains aqueous ammonium hydroxide ($NH_4OH$).

18. The method of claim 14, wherein the dissolution solution does not etch the Cu metal layer or the new oxidized Cu surface layer.

19. The method of claim 18, wherein the dissolution solution contains ammonium hydroxide ($NH_4OH$), and wherein a concentration of the ammonium hydroxide in the dissolution solution is maintained below a level that etches the Cu metal layer or the new oxidized Cu surface layer after selectively removing the complex-bound oxidized Cu surface layer.

20. The method of claim 14, wherein the complexing agent is dissolved in an organic solvent.

21. The method of claim 14, wherein the complexing agent includes oxalic acid that is dissolved in isopropyl alcohol (IPA).

22. The method of claim 14, wherein the substrate further has an exposed dielectric layer thereon that is not etched by steps b)-e).

* * * * *